US012765221B2

(12) United States Patent
Kim et al.

(10) Patent No.: US 12,765,221 B2
(45) Date of Patent: Oct. 13, 2026

(54) SEMICONDUCTOR DEVICE FOR VIDEO TRANSMISSION DISPLAY

(71) Applicant: Samsung Electronics Co., Ltd., Suwon-si (KR)

(72) Inventors: Myeongeon Kim, Suwon-si (KR); Bumsuk Kim, Suwon-si (KR); Jungchak Ahn, Suwon-si (KR); Kyungho Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 284 days.

(21) Appl. No.: 18/442,467

(22) Filed: Feb. 15, 2024

(65) Prior Publication Data

US 2024/0292708 A1 Aug. 29, 2024

(30) Foreign Application Priority Data

Feb. 23, 2023 (KR) ........................ 10-2023-0024593

(51) Int. Cl.
*H10K 59/65* (2023.01)
*H10K 59/131* (2023.01)
*H10K 59/95* (2026.01)
*H10W 72/90* (2026.01)
*H10W 80/00* (2026.01)
*H10W 90/00* (2026.01)

(52) U.S. Cl.
CPC ........... *H10K 59/65* (2023.02); *H10K 59/131* (2023.02); *H10K 59/95* (2023.02); *H10W 90/00* (2026.01); *H10W 72/941* (2026.01); *H10W 72/942* (2026.01); *H10W 72/951* (2026.01); *H10W 80/327* (2026.01); *H10W 90/792* (2026.01)

(58) Field of Classification Search
None
See application file for complete search history.

(56) References Cited

U.S. PATENT DOCUMENTS 7,781,716 B2 8/2010 Anderson et al.
8,773,562 B1 7/2014 Fan
(Continued)

FOREIGN PATENT DOCUMENTS

JP 2007-081203 A 3/2007
JP 2019-087963 A 6/2019
(Continued)

OTHER PUBLICATIONS

Office Action issued Aug. 26, 2026 in Korean Application No. 10-2023-0024593.

*Primary Examiner* — Nduka E Ojeh
(74) *Attorney, Agent, or Firm* — Harness, Dickey & Pierce, P.L.C.

(57) ABSTRACT

Provided is a semiconductor device for video transmission display including a display unit including a plurality of light emitting elements constituting a plurality of unit display pixels, an image sensor unit disposed on the display unit so that the plurality of unit image sensor pixels corresponding to the same color and the plurality of unit display pixels overlap each other at least partially in a vertical direction, and a plurality of connection paths each including at least one through electrode and electrically connecting the plurality of unit image sensor pixels corresponding to the same color to the plurality of unit display pixels.

20 Claims, 23 Drawing Sheets

(56) References Cited

U.S. PATENT DOCUMENTS

| | | | |
|---|---|---|---|
| 10,645,314 | B2 | 5/2020 | Otaka |
| 10,741,607 | B2 | 8/2020 | Yoon et al. |
| 10,948,712 | B2 | 3/2021 | Lapstun |
| 2018/0114807 | A1 | 4/2018 | Yamagishi et al. |
| 2018/0165496 | A1* | 6/2018 | Cheng ........................ G09F 9/00 |
| 2019/0103425 | A1* | 4/2019 | Yoon ...................... H10F 39/018 |
| 2019/0348457 | A1* | 11/2019 | Park ........................ H10K 59/65 |
| 2022/0285460 | A1 | 9/2022 | Kim et al. |
| 2024/0074283 | A1* | 2/2024 | Tsukamoto ............ H05B 33/12 |

FOREIGN PATENT DOCUMENTS

| | | | |
|---|---|---|---|
| KR | 10-0722111 | B1 | 5/2007 |
| KR | 10-2010-0126749 | A | 12/2010 |
| KR | 10-2015-0032373 | A | 3/2015 |
| KR | 10-2017-0033909 | A | 3/2017 |
| KR | 10-2019-0004678 | A | 1/2019 |
| KR | 10-2019-0038031 | A | 4/2019 |
| KR | 10-2019-0090241 | A | 8/2019 |
| KR | 10-2022-0027968 | A | 3/2022 |
| KR | 10-2022-0125839 | A | 9/2022 |
| WO | WO-2018-180577 | A1 | 10/2018 |

* cited by examiner

SEMICONDUCTOR DEVICE FOR VIDEO TRANSMISSION DISPLAY

CROSS-REFERENCE TO RELATED APPLICATION

This application is based on and claims priority under 35 U.S.C. § 119 to Korean Patent Application No. 10-2023-0024593, filed on Feb. 23, 2023, in the Korean Intellectual Property Office, the disclosures of which are incorporated by reference herein in their entirety.

BACKGROUND

The inventive concepts relate to a semiconductor device, and more particularly, to a semiconductor device for a video see through display.

In augmented reality (AR), display devices such as a monitor-based method, an optical see through method, and a video see through method are used. A monitor-based display device may be less immersive because it is the point of view of the camera rather than the point of view of the actual user, and optical transmissive display devices may find it difficult to synthesize computer graphics and images actually entering the eyes. A video transmissive display device has the advantage of easy synthesis of computer graphics and is thus widely used in AR.

SUMMARY

The inventive concepts provide a semiconductor device for video transmission display capable of reducing the size of a video transmission type display device.

To achieve the above technical problem, the inventive concepts provide the following semiconductor device for video transmission display.

According to an aspect of the inventive concepts, there is provided a semiconductor device for video transmission display, the semiconductor device including an image sensor unit including a semiconductor substrate, a plurality of light sensing elements in the semiconductor substrate and constituting a plurality of unit image sensor pixels, a first wiring structure on a first surface of the semiconductor substrate, the first wiring structure including a plurality of first wiring patterns and a first inter-wiring insulating layer surrounding the plurality of first wiring patterns, a plurality of color filter layers on a second surface of the semiconductor substrate such that the plurality of color filter layers at least partially overlap corresponding light sensing elements of the plurality of light sensing elements, and a plurality of microlenses on the plurality of color filter layers; a display unit including a second wiring structure on the first wiring structure and including a plurality of second wiring patterns and a second inter-wiring insulating layer surrounding the plurality of second wiring patterns, and a plurality of light emitting elements on the second wiring structure and constituting a plurality of unit display pixels; and a plurality of connection paths electrically connecting each of the plurality of unit image sensor pixels to a corresponding one the plurality of unit display pixels, the plurality of connection paths each including at least one through electrode.

According to another aspect of the inventive concepts, there is provided a semiconductor device for video transmission display, the semiconductor device including a display unit including a plurality of unit display pixels, each of the unit display pixels comprising a light emitting element; an image sensor unit including a plurality of unit image sensor pixels, each of the plurality of unit image sensors pixels including a light sensing element, at least portions of unit image sensor pixels of the plurality of unit image sensor pixels and corresponding ones of the plurality of unit display pixels corresponding to a same color are at least a portion overlaps each other in a vertical direction; and a plurality of connection paths, each including at least one through electrode, electrically connecting the plurality of unit image sensor pixels to the plurality of unit display pixels corresponding to the same color.

According to another aspect of the inventive concepts, there is provided a semiconductor device for video transmission display, the semiconductor device including an image sensor unit including a semiconductor substrate, a plurality of light sensing elements in the semiconductor substrate and constituting a plurality of unit image sensor pixels, a plurality of sensor gate electrodes on a first surface of the semiconductor substrate and constituting a plurality of transistors including a transfer transistor, a reset transistor, a source follower transistor, and a select transistor, a first wiring structure on the first surface of the semiconductor substrate, the first wiring structure including a plurality of first wiring patterns and a first inter-wiring insulating layer surrounding the plurality of first wiring patterns and the plurality of sensor gate electrodes, a plurality of color filter layers on a second surface of the semiconductor substrate such that each of the plurality of color filter layers at least partially overlap corresponding light sensing elements of the plurality of corresponding light sensing elements, and a plurality of microlenses on the plurality of color filter layers; a display unit on the first wiring structure opposite to the semiconductor substrate and including a second wiring structure including a plurality of second wiring patterns and a second inter-wiring insulating layer surrounding the plurality of second wiring patterns, a semiconductor layer between the first wiring structure and the second wiring structure, a plurality of light emitting elements on the second wiring structure, the plurality of light emitting elements constituting a plurality of unit display pixels, and a display pixel circuit connected to each of the plurality of light emitting elements, the display pixel circuit including a driving transistor and a switching transistor, each of which is a metal oxide semiconductor field effect transistor; and a plurality of connection paths, each of the plurality of connection paths including at least one through electrode penetrating the first inter-wiring insulating layer and the semiconductor layer, and electrically connecting the plurality of unit image sensor pixels to the plurality of unit display pixels corresponding a same color, and wherein the plurality of unit image sensor pixels and the plurality of unit display pixels corresponding to the same color overlap, at least in part, to each other in a vertical direction.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
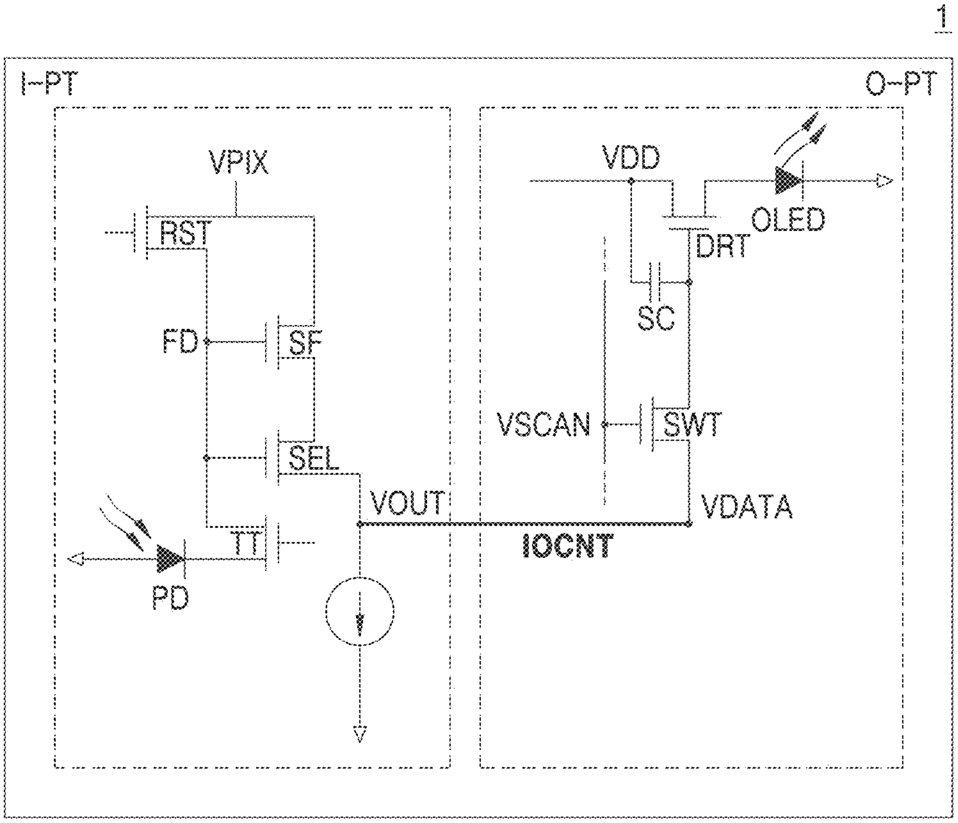
FIG. 1 is an equivalent circuit diagram of a semiconductor device for video transmission display according to at least one embodiment.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure. In the drawings, like numerals refer to like elements throughout, therefore the repeated descriptions may be omitted.

The size and thickness of each configuration shown in the drawings are arbitrarily shown for better understanding and ease of description, but the present disclosure is not limited thereto. In the drawings, the thickness of layers, films, panels, regions, etc., are enlarged for clarity. The thicknesses of some layers and areas are exaggerated for convenience of explanation. Additionally, spatially relative terms, such as "lower," "upper," "top," and/or the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly.

When the terms "about" or "substantially" are used in this specification in connection with a numerical value and/or geometric terms, it is intended that the associated numerical value includes a manufacturing tolerance (e.g., ±10%) around the stated numerical value. Further, regardless of whether numerical values and/or geometric terms are modified as "about" or "substantially," it will be understood that these values should be construed as including a manufacturing or operational tolerance (e.g., ±10%) around the stated numerical values and/or geometric. When referring to "C to D", this means C inclusive to D inclusive unless otherwise specified.

FIG. 1 is an equivalent circuit diagram of a semiconductor device for video transmission display according to at least one embodiment.

Referring to FIG. 1, a semiconductor device for video transmission display 1 includes an image sensor unit I-PT and a display unit O-PT. In at least one embodiment, the semiconductor device for video transmission display 1 may be a single chip including the image sensor unit I-PT and the display unit O-PT. For example, the image sensor unit I-PT may be a part of a single-chip semiconductor device for video transmission display 1 and the display unit O-PT may be another part of the single-chip semiconductor device for video transmission display 1. The semiconductor device for video transmission display 1 may be a semiconductor device in which the image sensor unit I-PT (corresponding to an image sensor) and the display unit O-PT (corresponding to a display) are implemented as a single chip, e.g., without implementing an image sensor and a display element as separate chips.

The image sensor unit I-PT may include a light sensing element PD, a transfer transistor TT, a floating diffusion region FD, a reset transistor RST, a source follower transistor SF, and a select transistor SEL. The image sensor unit I-PT may include a plurality of unit image sensor pixels. The light sensing element PD and the transfer transistor TT may constitute a unit image sensor pixel. In some embodiments, each of the plurality of unit image sensor pixels may sense red, green, or blue light, and/or each of the plurality of unit image sensor pixels may sense cyan, magenta, or yellow light.

Each of the transfer transistor TT, the reset transistor RST, the source follower transistor SF, and the select transistor SEL may respectively include a transfer gate, a reset gate, a source follower gate, and a select gate. In some embodiments, the transfer gate may be a vertical gate and each of the reset gate, the source follower gate, and the select gate may be a planar gate but the examples are not limited thereto. In some embodiments, each of the transfer gate, the reset gate, the source follower gate, and the select gate may be a planar gate. In some other embodiments, the transfer gate may be a vertical gate and at least one of the reset gate, the source follower gate, and the select gate may also be a vertical gate.

The transfer transistor TT may include a source region and a drain region connected to the transfer gate, a floating diffusion region FD, and a light sensing element PD. For example, the transfer gate may be disposed between the light sensing element PD and the floating diffusion region FD to transfer charges generated by the light sensing element PD to the floating diffusion region FD. The reset transistor RST may include a source region connected to the reset gate, a floating diffusion region FD, and a drain region connected to the image power supply voltage VPIX. The source follower transistor SF may include a source follower gate connected to a floating diffusion region FD, a source region connected to the source region of the select transistor SEL, and a drain region to which the image power supply voltage VPIX is connected. The select transistor SEL may include a select gate, a source region connected to the source region of the source follower transistor SF, and a drain region to which the image output voltage VOUT is connected.

In FIG. 1, one floating diffusion region FD, one reset transistor RST, one source follower transistor SF, and one select transistor SEL are illustrated as being connected to one unit image sensor pixel including one light sensing element PD and one transfer transistor TT, but the examples are not limited thereto. For example, one floating diffusion region FD, one reset transistor RST, one source follower transistor SF, and one select transistor SEL may be connected to two unit image sensor pixels comprising two light sensing elements PD and two transfer transistors TT, so that two light sensing elements PD and two transfer transistors TT constitute a shared pixel, and/or one floating diffusion region FD, one reset transistor RST, one source follower transistor SF, and one select transistor SEL are connected to four unit image sensor pixels consisting of four light sensing elements PD and four transfer transistors TT, so that four light sensing elements PD and four transfer transistors TT may constitute a common pixel.

The display unit O-PT includes a driving transistor DRT, a switching transistor SWT, and a storage capacitor SC, and may include a display pixel circuit to which the scan signal VSCAN and the data signal VDATA are connected, and a light emitting element OLED connected to the display pixel circuit. For example, the light emitting element OLED may be an organic light-emitting diode. A display unit O-PT may include a plurality of unit display pixels. The display pixel circuit and the light emitting element OLED may constitute a unit display pixel. In some embodiments, each of the plurality of unit display pixels may be configured to emit red, green, or blue light; and/or each of the plurality of other unit display pixels may be configured to emit cyan, magenta, or yellow light.

A scan signal VSCAN and a data signal VDATA are provided to the switching transistor SWT, and the data signal VDATA may be transferred to the driving transistor DRT according to the input scan signal VSCAN. For example, the switching transistor SWT may include a switching gate, a source region, and a drain region. A scan signal VSCAN is provided to the switching gate of the switching transistor SWT, a data signal VDATA is provided to the source region, and a source region of the driving transistor DRT may be connected to the drain region.

The storage capacitor SC may be is connected to the switching transistor SWT and the display driving voltage VDD and may store a voltage corresponding to the difference between the voltage received from the switching transistor SWT and the display driving voltage VDD.

The driving transistor DRT may be connected to the display driving voltage VDD and the storage capacitor SC and control a driving current flowing through the light emitting element OLED from the display driving voltage VDD in response to a voltage value stored in the storage capacitor SC. For example, the driving transistor DRT may include a driving gate, a source region, and a drain region. The storage capacitor SC is connected to the switching gate of the driving transistor DRT, the drain region of the switching transistor SWT is connected to the source region, and a first electrode of the light emitting element OLED may be connected to the drain region. The light emitting element OLED may be configured to emit light having a preset luminance by a driving current.

In FIG. 1, the case where the display pixel circuit includes two transistors and one storage capacitor has been described but the examples are not limited thereto. For example, the display pixel circuit may include three or more transistors and/or two or more storage capacitors.

In some embodiments, a light emitting element OLED may be configured to emit red, green, blue, or white light, and/or the light emitting element OLED may be configured to emit cyan, magenta, or yellow light, however the examples are not limited thereto.

The image sensor unit I-PT and the display unit O-PT may be electrically connected to one another through a connection path IOCNT within the semiconductor device for video transmission display 1. The connection path IOCNT may electrically connect the image output voltage VOUT of the image sensor unit I-PT to the data signal VDATA of the display unit O-PT. For example, the image output voltage VOUT of the image sensor unit I-PT and the data signal VDATA of the display unit O-PT may have an equal potential. In some embodiments, the connection path IOCNT may electrically connect a drain region of the select transistor SEL to a source region of the switching transistor SWT. The connection path IOCNT may include at least one through electrode. For example, the drain region of the select transistor SEL and the source region of the switching transistor SWT may be electrically connected to one another through at least one through electrode. For example, in some embodiments, one through electrode may be disposed between the drain region of the select transistor SEL and the source region of the switching transistor SWT. In some other embodiments, two through electrodes between the drain region of the select transistor SEL and the source region of the switching transistor SWT, and one or two connection pads between the two through electrodes may be disposed.

In the semiconductor device for video transmission display 1 according to the inventive concepts, the size may be reduced by implementing the image sensor unit I-PT and display unit O-PT as a single chip, and since the semiconductor device for video transmission display 1 has a connection path IOCNT that electrically connects the image output voltage VOUT of the image sensor unit I-PT to the data signal VDATA of the display unit O-PT, operation performance may be improved.

Figure 2A:
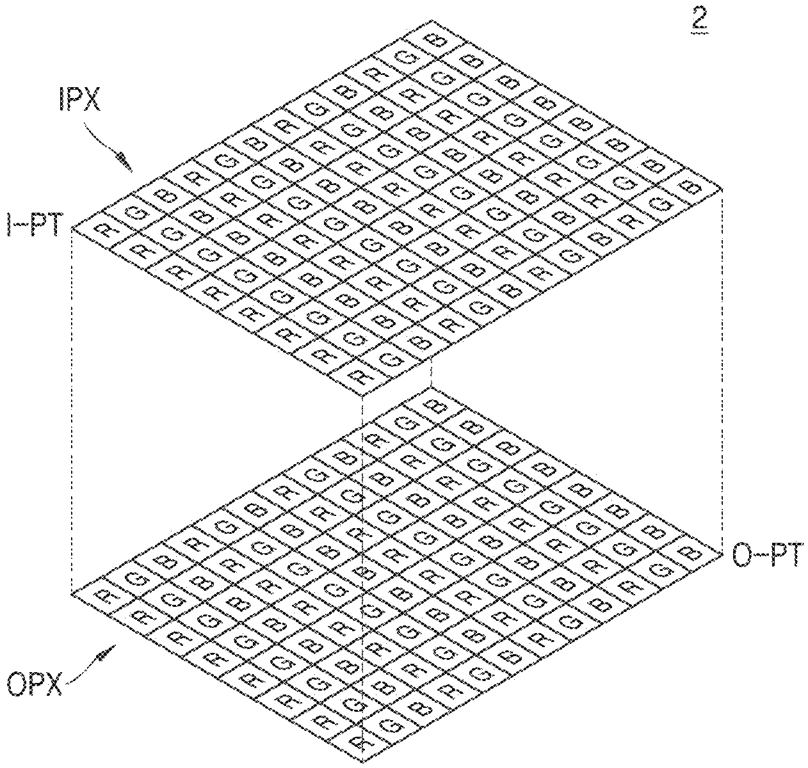
FIGS. 2A and 2B are conceptual diagrams illustrating an alignment relationship between an image sensor pixel and a display pixel included in a semiconductor device for video transmission display according to at least one embodiment.
Figure 2B:
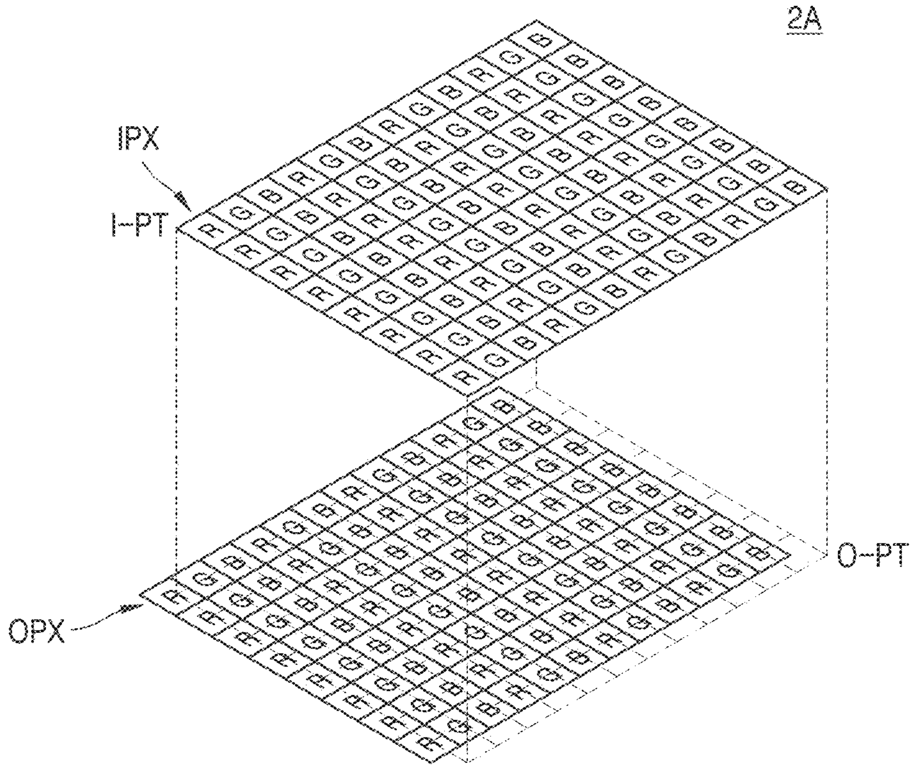

FIGS. 2A and 2B are conceptual diagrams illustrating an alignment relationship between an image sensor pixel and a display pixel included in a semiconductor device for video transmission display according to at least one embodiment.

Referring to FIG. 2A, a semiconductor device for video transmission display 2 includes an image sensor unit I-PT and a display unit O-PT. The semiconductor device for video transmission display 2 may be a single chip including the image sensor unit I-PT and the display unit O-PT. For example, the image sensor unit I-PT may be a part of a single-chip semiconductor device for video transmission display 2 and the display unit O-PT may be another part of a single-chip semiconductor device for video transmission display 2.

The image sensor unit I-PT may include a plurality of unit image sensor pixels IPX and the display unit O-PT may include a plurality of unit display pixels OPX. In at least some embodiments, each of the plurality of unit image sensor pixels IPX may sense red R, green G, or blue B light, and each of the plurality of unit display pixels OPX may be configured to emit red R, green G, or blue B light but is not limited thereto; and/or each of the plurality of unit image sensor pixels IPX may sense cyan, magenta, or yellow light, and each of the plurality of unit display pixels OPX may be configured to emit light of cyan, magenta, or yellow, however the examples are not limited thereto.

The unit image sensor pixel IPX and the unit display pixel OPX corresponding to the same color may be disposed so that at least a portion overlaps each other in a vertical direction. In some embodiments, unit image sensor pixels IPX and unit display pixels OPX corresponding to the same color are vertically overlapped with each other, and unit image sensor pixels IPX and unit display pixels OPX corresponding to different colors may be arranged so as not to overlap each other.

Referring to FIGS. 1 and 2A together, the connection path IOCNT may electrically connect the image output voltage VOUT of the unit image sensor pixel IPX corresponding to the same color to the data signal VDATA of the unit display pixel OPX. Since the unit image sensor pixel IPX and the unit display pixel OPX corresponding to the same color overlap each other in a vertical direction, the connection path IOCNT may be formed to have the shortest extension length. Accordingly, the size of the semiconductor device for video transmission display 2 may be reduced and operational performance may be improved.

Referring to FIG. 2B, a semiconductor device for video transmission display 2A includes an image sensor unit I-PT and a display unit O-PT. The semiconductor device for video transmission display 2 may be a single chip including the image sensor unit I-PT and the display unit O-PT. For example, the image sensor unit I-PT may be a part of a single-chip semiconductor device for video transmission display 2A, and the display unit O-PT may be another part of a single-chip semiconductor device for video transmission display 2A.

The image sensor unit I-PT may include a plurality of unit image sensor pixels IPX, and the display unit O-PT may include a plurality of unit display pixels OPX. In at least some embodiments, each of the plurality of unit image sensor pixels IPX may sense red R, green G, or blue B light, and each of the plurality of unit display pixels OPX may be configured to emit red R, green G, or blue B light; and/or, each of the plurality of unit image sensor pixels IPX may sense cyan, magenta, or yellow light, and each of the plurality of unit display pixels OPX may be configured to emit light of cyan, magenta, or yellow, however the examples are not limited thereto.

The unit image sensor pixel IPX and the unit display pixel OPX corresponding to the same color may be disposed so that portions overlap each other in the vertical direction. In some embodiments, the unit image sensor pixel IPX and the unit display pixel OPX corresponding to the same color partially overlap each other in the vertical direction, and the unit image sensor pixel IPX and the unit display pixel OPX corresponding to different colors may also be arranged so that different portions overlap each other.

Referring to FIGS. 1 and 2B together, the connection path IOCNT may electrically connect the image output voltage VOUT of the unit image sensor pixel IPX corresponding to the same color to the data signal VDATA of the unit display pixel OPX. Since the unit image sensor pixel IPX and the unit display pixel OPX corresponding to the same color partially overlap each other in the vertical direction, the connection path IOCNT may be formed to have the shortest extension length. Accordingly, the size of the semiconductor device for video transmission display 2A may be reduced and operational performance may be improved.

Figure 3:
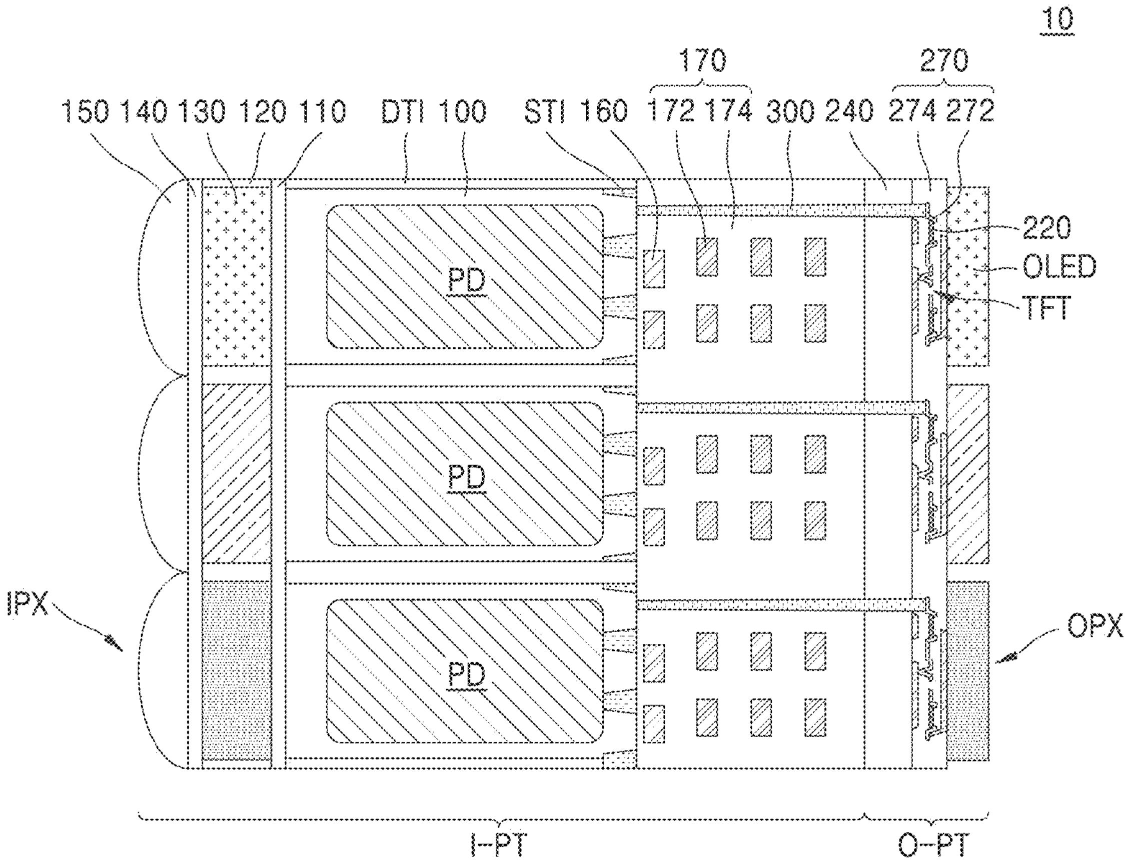
FIG. 3 is a cross-sectional view illustrating a semiconductor device for video transmission display according to at least one embodiment.

FIG. 3 is a cross-sectional view illustrating a semiconductor device for video transmission display according to at least one embodiment.

Referring to FIG. 3, a semiconductor device for video transmission display 10 includes an image sensor unit I-PT and a display unit O-PT. The semiconductor device for video transmission display 10 may be a single chip including the image sensor unit I-PT and the display unit O-PT.

In FIG. 3, to show the case where the semiconductor device for video transmission display 10 is mounted in an electronic device, although it is shown that the image sensor unit I-PT is disposed on the left in the horizontal direction and the display unit O-PT is disposed on the right in the horizontal direction, hereinafter, for convenience of description, it will be described that the image sensor unit I-PT is disposed on the upper side in the vertical direction and the display unit O-PT is disposed on the lower side in the vertical direction; and the other spatially relative descriptors will be adjusted accordingly. The semiconductor device for video transmission display 10 includes a display unit O-PT and an image sensor unit I-PT disposed on the display unit O-PT.

The image sensor unit I-PT may include a sensor substrate 100 having a plurality of unit image sensor pixels IPX including a plurality of light sensing elements PD, a plurality of microlenses 150 disposed on the sensor substrate 100, a first wiring structure 170 disposed under the sensor substrate 100, and a plurality of color filter layers 130 between the sensor substrate 100 and the plurality of microlenses 150.

The sensor substrate 100 may have a lower surface and an upper surface that are opposite to each other. The lower and upper surfaces of the sensor substrate 100 may also be referred to as first and second surfaces of the sensor substrate 100. The sensor substrate 100 may be referred to as a semiconductor substrate, a substrate layer, a first semiconductor substrate, a first substrate, a first semiconductor substrate layer, and/or a first substrate layer. The sensor substrate 100 may include a semiconductor. For example, the sensor substrate 100 may include an elemental and/or a compound semiconductor, such as a group IV semiconductor material, a group III-V semiconductor material, and/or a group II-VI semiconductor material. The group IV semiconductor material may include, for example, silicon (Si), germanium (Ge), and/or silicon germanium (SiGe). The group III-V semiconductor material may include, for example, gallium arsenide (GaAs), indium phosphorus (InP), gallium phosphorus (GaP), indium arsenic (InAs), indium antimony (InSb), and/or indium gallium arsenide (InGaAs). The group II-VI semiconductor material may include, for example, zinc telluride (ZnTe) and/or cadmium sulfide (CdS). In some embodiments, the sensor substrate 100 may include a P-type silicon substrate. In some other embodiments, the sensor substrate 100 may include a P-type bulk substrate and a P-type or N-type epitaxial layer grown thereon. In some other embodiments, the sensor substrate 100 may include an N-type bulk substrate and a P-type or N-type epitaxial layer grown on the N-type bulk substrate.

A plurality of unit image sensor pixels IPX may be planarly arranged in a matrix form within an image sensor unit I-PT. The plurality of unit image sensor pixels IPX may include a plurality of light sensing elements PD disposed on the sensor substrate 100. In at least one embodiment, the sensor substrate 100 may be doped with impurities of a first conductivity type, and each of the plurality of light sensing elements PD may be doped with impurities of a second conductivity type that is different from the first conductivity type. In some embodiments, the first conductivity type may be p-type and the second conductivity type may be n-type. For example, impurities of the first conductivity type may include one or more of boron (B), aluminum (Al), gallium (Ga), indium (In), thallium (Tl), zinc (Zn), cadmium (Cd), mercury (Hg), and/or the like. For example, impurities of the second conductivity type may include one or more of nitrogen (N), phosphorus (P), arsenic (As), antimony (Sb), bismuth (Bi), sulfur(S), selenium (Se), tellurium (Te), polonium (Po), and/or the like.

An element isolation region STI and a pixel isolation region DTI may be disposed in the sensor substrate 100. A plurality of unit image sensor pixels IPX may be defined by the pixel isolation region DTI, and a pixel isolation region DTI may surround at least a portion of each of a plurality of light sensing elements PD in a plan view within the sensor substrate 100. The pixel isolation region DTI may be disposed between one light sensing element PD of a plurality of light sensing elements PD and another light sensing element PD adjacent thereto. The pixel isolation region DTI is disposed between each of a plurality of light sensing elements PD arranged in a matrix form in a plan view, and may have a grid or mesh shape in a plan view.

An active region and a floating diffusion region may be defined on the sensor substrate 100 by the element isolation region STI. In some embodiments, the element isolation region STI may be composed of a triple layer including a combination of at least three types of insulating films including a first layer, a second layer, and a third layer. For example, the first layer may be made of oxide, the second layer may be made of nitride, and the third layer may be made of oxide, but the examples are not limited thereto. In some embodiments, the element isolation region STI may be composed of a single layer made of one type of insulating film, a double layer made of two types of insulating films, and/or a multi-layer made of four or more types of insulating films.

The pixel isolation region DTI may extend from the lower surface of the sensor substrate 100 to the upper surface of the sensor substrate 100. The element isolation region STI may extend from the lower surface of the sensor substrate 100 to the inside of the element isolation region STI. In some embodiments, each of the pixel isolation region DTI and the element isolation region STI may have a tapered shape extending from the lower surface of the sensor substrate 100 toward the upper surface the substrate 100 with a narrowing horizontal width. An extension length of the pixel isolation region DTI in the vertical direction may be greater than an extension length of the element isolation region STI. For example, a pixel isolation region DTI may penetrate the sensor substrate 100 in the vertical direction, and an element isolation region STI may not penetrate the sensor substrate 100. In some embodiments, the pixel isolation region DTI may overlap a part of the element isolation region STI in the vertical direction. For example, the pixel isolation region DTI and a part of the element isolation region STI may pass through the sensor substrate 100 together.

In some embodiments, sensor gate electrodes 160 constituting a plurality of transistors may be disposed on the lower surface of the sensor substrate 100. For example, the plurality of transistors may include a transfer transistor configured to transfer charges generated by a light sensing element PD to the floating diffusion region, a reset transistor configured to periodically reset the charge stored in the floating diffusion region, a drive transistor serving as a source follower buffer amplifier and configured to buffer a signal according to the charge in the floating diffusion region, and a select transistor for switching and addressing to select the unit image sensor pixel IPX. However, the plurality of transistors are not limited thereto.

Each of the sensor gate electrodes 160 constituting the plurality of transistors may be a vertical gate or a planar gate. FIG. 3 shows a planar gate as an example of the sensor gate electrodes 160 constituting the plurality of transistors but the examples are not limited thereto. For example, some of the sensor gate electrodes 160 constituting the plurality of transistors may be vertical gates formed in a recess gate type extending from the lower surface of the sensor substrate 100 into the sensor substrate 100.

A first wiring structure 170 may be disposed on and/or below the lower surface of the sensor substrate 100. The first wiring structure 170 may include a plurality of first wiring patterns 172 and a first inter-wiring insulating layer 174 surrounding the plurality of first wiring patterns 172. The first inter-wiring insulating layer 174 may surround the plurality of first wiring patterns 172 and the sensor gate electrode 160. The plurality of first wiring patterns 172 may be electrically connected to the sensor gate electrodes 160 or the active region of the sensor substrate 100. The plurality of first wiring patterns 172 may have a stacked structure of a plurality of first wiring lines and a plurality of first wiring vias (not shown). For example, the plurality of first wiring patterns 172 may include a conductive material, such as tungsten, aluminum, copper, tungsten silicide, titanium silicide, tungsten nitride, titanium nitride, doped polysilicon, and/or the like. For example, the first inter-wiring insulating layer 174 may include an insulating material, such as silicon oxide, silicon nitride, silicon oxynitride, and/or the like.

A plurality of color filter layers 130 may be disposed on the upper surface of the sensor substrate 100. The plurality of color filter layers 130 may vertically overlap at least a portion of the plurality of corresponding light sensing elements PD. In some embodiments, a first passivation layer 110 may be disposed between the upper surface of the sensor substrate 100 and the plurality of color filter layers 130. In some embodiments, the first passivation layer 110 may be formed of oxide, nitride, oxynitride, and/or a combination thereof. For example, the first passivation layer 110 may be formed of at least one of silicon nitride, hafnium oxide, aluminum oxide, tantalum oxide, and/or the like, and/or a stacked structure thereof.

A guide pattern 120 may be formed on the first passivation layer 110. In the plan view, the guide pattern 120 may have a grid shape or a mesh shape. The grid or mesh shape of the first passivation layer 110 may match the grid or mesh shape of the pixel isolation region DTI. The guide pattern 120 has an inclination angle with one light sensing element PD and may prevent incident light from entering an adjacent light sensing element PD. The guide pattern 120 may include, for example, at least one metal material selected from, e.g., tungsten, aluminum, titanium, ruthenium, cobalt, nickel, copper, gold, silver, and/or platinum.

On the first passivation layer 110 on which the guide pattern 120 is formed, a plurality of color filter layers 130 vertically overlapping a plurality of light sensing elements PD and a plurality of microlenses 150 disposed on the plurality of color filter layers 130 may be disposed. The plurality of color filter layers 130 may pass light incident through the plurality of microlenses 150 and allow only light of a selected wavelength to be incident to the plurality of light sensing elements PD. In some embodiments, a second passivation layer 140 may be disposed between the plurality of color filter layers 130 and the plurality of microlenses 150. The second passivation layer 140 may be formed of oxide, nitride, oxynitride, or a combination thereof.

Each of the plurality of color filter layers 130 may include, for example, one of a red R filter, a blue B filter, or a green G filter. Alternatively, each of the plurality of color filter layers 130 may include one of a cyan (C) filter, a magenta (M) filter, or a yellow (Y) filter. For example, in at least one embodiment, on each light sensing element PD, a color filter layer 130 of one of an R filter, a B filter, and a G filter, or a color filter layer 530 of one of a C filter, an M filter, and a Y filter is formed, and each unit image sensor pixel IPX may recognize a single color by sensing components of separated incident light.

The microlenses 150 may condense light incident to the semiconductor device for video transmission display 10 on the light sensing element PD of the unit image sensor pixel IPX. In some embodiments, the microlenses 150 may include an organic material layer and/or an inorganic material layer conformally covering the surface of the organic material layer. For example, the organic material layer may be made of a resin such as a TMR-based resin (manufactured by Tokyo Ohka Kogyo, Co.) and/or an MFR-based resin (manufactured by Japan Synthetic Rubber Corporation).

The display unit O-PT may be disposed below the image sensor unit I-PT. The display unit O-PT may include a base insulating layer 240, a second wiring structure 270 disposed under the base insulating layer 240, and a light emitting element OLED disposed under the second wiring structure 270.

The base insulating layer 240 is disposed under the first wiring structure 170 so that the lower surface of the first inter-wiring insulating layer 174 and the upper surface of the base insulating layer 240 may come into contact with each other. The base insulating layer 240 may include, e.g., silicon oxide, silicon nitride, and/or the like. The second wiring structure 270 may include a plurality of second wiring patterns 272 and a second inter-wiring insulating layer 274 surrounding the plurality of second wiring patterns 272. A thin film transistor TFT and a storage capacitor SC (see FIG. 1) may be disposed in the second wiring structure 270. The thin film transistor TFT may constitute the driving transistor DRT and the switching transistor SWT shown in FIG. 1.

The thin film transistor TFT may include a semiconductor layer 220 including a channel region and a source region and a drain region on both sides of the channel region, a display gate electrode overlapping the channel region, and a source electrode and a drain electrode electrically connected to each of the source region and the drain region. The plurality of second wiring patterns 272 may include the display gate electrode, the source electrode, and the drain electrode.

The semiconductor layer 220 may be made of an oxide semiconductor or an elemental or compound semiconductor (e.g., silicon). In some embodiments, when the semiconductor layer 220 is made of an oxide semiconductor, the semiconductor layer 220 may include semiconductors oxides of at least one of Indium (In), Gallium (Ga), Tin (Sn), Zirconium (Zr), Vanadium (V), Hafnium (Hf), Cadmium (Cd), Germanium (Ge), Chromium (Cr), Titanium (Ti), and zinc (Zn). For example, the semiconductor layer 220 may be an oxide semiconductor such as ITZO (InSnZnO), IGZO (InGaZnO), and/or the like. In at least one embodiment, when the semiconductor layer 220 is made of silicon, the semiconductor layer 220 may include amorphous silicon (a-Si) and/or low-temperature poly-silicon (LTPS) obtained by crystallizing a-Si.

In at least some embodiments, the source region and the drain region of the semiconductor layer 220 may include relatively higher concentrations of impurities, compared to, e.g., the channel region. Here, the impurities may be impurities of the first conductivity type or impurities of the second conductivity type.

The display gate electrode, the source electrode, and the drain electrode may include conductive materials, such as molybdenum (Mo), aluminum (Al), copper (Cu), titanium (Ti), and/or the like, and may include a single layer or multiple layers. For example, the display gate electrode may be a single layer of Mo, and the source electrode and the drain electrode may have a multilayer structure of Ti/Al/Ti.

The storage capacitor SC (see FIG. 1) may include a lower electrode and an upper electrode vertically overlapping the lower electrode. The lower electrode and the upper electrode of the storage capacitor SC may overlap in the vertical direction with a portion of the second inter-wiring insulating layer 274 therebetween. In these cases, a portion of the second inter-wiring insulating layer 274 may function as a dielectric layer of the storage capacitor SC. In some embodiments, the lower electrode of the storage capacitor SC may be integrally provided with the display gate electrode of the thin film transistor TFT. In some other embodiments, the lower electrode of the storage capacitor SC and the display gate electrode of the thin film transistor TFT may be separate and independent components spaced apart from each other. In at least some embodiments, the upper electrode of the storage capacitor SC may include aluminum (Al), platinum (Pt), palladium (Pd), silver (Ag), magnesium (Mg), gold (Au), nickel (Ni), neodymium (Nd), iridium (Ir), chromium (Cr)), lithium (Li), calcium (Ca), molybdenum (Mo), titanium (Ti), tungsten (W), copper (Cu), and/or the like; and may be provided with a single layer or multiple layers of the aforementioned materials.

The second inter-wiring insulating layer 274 may include a single layer or multiple layers of a film made of an inorganic material including oxide or nitride or a film made of an organic material. For example, the second inter-wiring insulating layer 274 may include at least one of silicon oxide, silicon nitride, silicon oxynitride, aluminum oxide, titanium oxide, tantalum oxide, hafnium oxide, and/or zinc oxide; and/or the second inter-wiring insulating layer 274 may include general purpose polymers such as benzocyclobutene, polyimide, hexamethyldisiloxane, polymethyl methacrylate, polystyrene, a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, a blend thereof, and/or the like.

A light emitting element OLED may be disposed on the second wiring structure 270. In some embodiments, the light emitting element might be, e.g., light emitting diode and/or an organic light emitting diode. In some embodiments, a light emitting element OLED may be configured to emit red, green, blue or white light; and/or the light emitting element OLED may be configured to emit cyan, magenta, or yellow light.

For example, a light emitting element OLED may include a first electrode, a second electrode, and a middle layer between the first electrode and the second electrode. The first electrode may be an anode and the second electrode may be a cathode.

The first electrode may be a (semi-) transmissive electrode or a reflective electrode. The first electrode may include a reflective film formed of aluminum (Al), platinum (Pt), palladium (Pd), silver (Ag), magnesium (Mg), gold (Au), nickel (Ni), neodymium (Nd), iridium (Ir), chromium (Cr)), lithium (Li), calcium (Ca), molybdenum (Mo), titanium (Ti), tungsten (W), copper (Cu), a compound thereof, and/or the like, and a transparent or translucent electrode layer formed on the reflective film. The transparent or translucent electrode layer may be, e.g., at least one selected from Indium tin oxide (ITO), indium zinc oxide (IZO), zinc oxide (ZnO), indium oxide (In2O3), indium gallium oxide (IGO), aluminum zinc oxide (AZO), and/or the like. For example, the first electrode may have a structure in which ITO/Ag/ITO are sequentially stacked. That is, in at least one embodiment, the outermost layer of the first electrode may include indium tin oxide (ITO). The first electrode may be electrically connected to the source electrode or the drain electrode of the thin film transistor TFT.

The second electrode may include a conductive material having a low work function. For example, the second electrode may include a (semi-) transparent layer including silver (Ag), magnesium (Mg), aluminum (Al), platinum (Pt), palladium (Pd), gold (Au), nickel (Ni), neodymium (Nd), iridium (Ir), chromium (Cr)), lithium (Li), calcium (Ca) alloys thereof, and/or the like. Alternatively, the second electrode may further include a layer, such as ITO, IZO, ZnO, $In_2O_3$, and/or the like on the (semi-) transparent layer including the above-described material.

In at least some embodiments, the middle layer may include a first functional layer, a light emitting layer, and a second functional layer. The first functional layer and the second functional layer may be selectively disposed below and above the light emitting layer, respectively. In at least one embodiment, the first functional layer may be disposed below the light emitting layer and the second functional layer may be disposed above the light emitting layer. The first functional layer and the second functional layer disposed below and above the light emitting layer may be collectively referred to as organic functional layers.

The first functional layer may include a hole injection layer (HIL) and/or a hole transport layer (HTL), and the second functional layer may include an electron transport layer (ETL) and/or an electron injection layer (EIL).

In some embodiments, the light emitting layer may include an organic material including a fluorescent and/or phosphorescent material that emits red, green, blue, or white light and/or that emits cyan, magenta, or yellow light. In some embodiments, the light emitting layer may include a low molecular weight organic material or a high molecular weight organic material.

When the light emitting layer includes a low molecular weight organic material, the middle layer may have a structure in which a hole injection layer, a hole transport layer, a light emitting layer, an electron transport layer, and an electron injection layer are stacked in a single or complex structure, and a low molecular weight organic material may include various organic materials, such as Copper phthalocyanine (CuPc), N,N'-di(naphthalen-1-yl)-N,N'-diphenyl-benzidine (N,N'-Di(napthalene-1-yl)-N,N'-diphenyl-benzidine (NPB)), tris-8-hydroxyquinoline aluminum ($Alq_3$)), and/or the like.

When the light emitting layer includes a polymer organic material, the middle layer may have a structure including a hole transport layer and a light emitting layer. For example, the hole transport layer may include poly(3,4-ethylenedioxythiophene (PEDOT), and the light emitting layer may include a polymer material such as polyparaphenylene vinylene (PPV), polyfluorene, and/or the like. Such a light emitting layer may be formed by screen printing, inkjet printing, laser induced thermal imaging (LITI), and/or the like.

The semiconductor device for video transmission display 10 may include a plurality of through electrodes 300 electrically connecting an image sensor unit I-PT to a display unit O-PT. Each of the plurality of through electrodes 300 may be a connection path IOCNT shown in FIG. 1. For example, the connection path IOCNT may comprise one of the through electrodes 300. The plurality of through electrodes 300 may extend from the second wiring structure 270 to the sensor substrate 100. The plurality of through electrodes 300 may pass through the first inter-wiring insulating layer 174 and the base insulating layer 240. In some embodiments, the plurality of through electrodes 300 may penetrate the first inter-wiring insulating layer 174 and the base insulating layer 240 and extend into the second inter-wiring insulating layer 274.

Each of the plurality of through electrodes 300 may electrically connect the unit image sensor pixel IPX to the unit display pixel OPX corresponding to the same color. In some embodiments, each of the plurality of through electrodes 300 may extend from the portion of the source electrode connected to the source region of the switching transistor SWT (see FIG. 1) among the plurality of second wiring patterns 272 to a drain region of a select transistor disposed in the active region of the sensor substrate 100. In some other embodiments, each of the plurality of through electrodes 300 may extend from the portion of the source region of the switching transistor SWT of the semiconductor layer 220 to a drain region of a select transistor disposed in the active region of the sensor substrate 100. In some embodiments, each of the plurality of through electrodes 300 may have a tapered shape extending from the second wiring structure 270 toward the sensor substrate 100 and narrowing in horizontal width.

As the semiconductor device for video transmission display 10 according to the inventive concepts may be reduced in size by implementing an image sensor unit I-PT and a display unit O-PT as a single chip vertically overlapping and disposed, and includes a plurality of through electrodes 300 electrically connecting a plurality of unit image sensor pixels IPX of the image sensor unit I-PT corresponding to the same color to a plurality of unit display pixels OPX of the display unit O-PT, operation performance may be improved.

Figure 4:
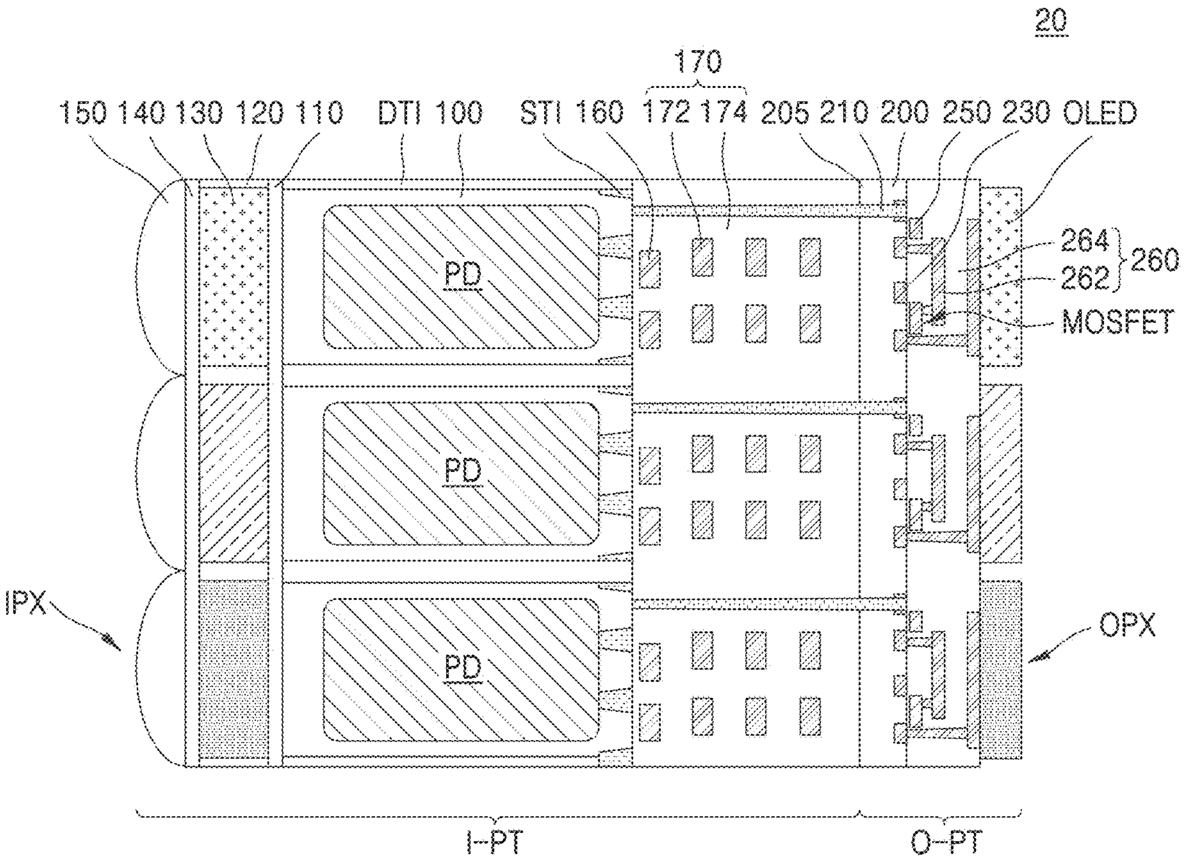
FIG. 4 is a cross-sectional view illustrating a semiconductor device for video transmission display according to at least one embodiment.

FIG. 4 is a cross-sectional view illustrating a semiconductor device for video transmission display according to at least one embodiment. In FIG. 4, the descriptions overlapping those of FIG. 3 may be omitted for brevity.

Referring to FIG. 4, a semiconductor device for video transmission display 20 includes an image sensor unit I-PT and a display unit O-PT. The semiconductor device for video transmission display 20 may be a single chip including the image sensor unit I-PT and the display unit O-PT.

In FIG. 4, to show the case where the semiconductor device for video transmission display 20 is mounted in an electronic device, although it is shown that the image sensor unit I-PT is disposed on the left in the horizontal direction and the display unit O-PT is disposed on the right in the horizontal direction, hereinafter, for convenience of description, it will be described that the image sensor unit I-PT is disposed on the upper side in the vertical direction and the display unit O-PT is disposed on the lower side in the vertical direction. The semiconductor device for video transmission display 20 includes a display unit O-PT and an image sensor unit I-PT disposed on the display unit O-PT.

The image sensor unit I-PT may include a sensor substrate 100 having a plurality of unit image sensor pixels IPX including a plurality of light sensing elements PD, a plurality of microlenses 150 disposed on the sensor substrate 100, a first wiring structure 170 disposed under the sensor substrate 100, and a plurality of color filter layers 130 between the sensor substrate 100 and the plurality of microlenses 150.

An element isolation region STI and a pixel isolation region DTI may be disposed in the sensor substrate 100. In some embodiments, sensor gate electrodes 160 constituting a plurality of transistors may be formed on the lower surface of the sensor substrate 100. A first wiring structure 170 may be disposed on the lower surface of the sensor substrate 100. The first wiring structure 170 may include a plurality of first wiring patterns 172 and a first inter-wiring insulating layer 174 surrounding the plurality of first wiring patterns 172.

A plurality of color filter layers 130 may be disposed on the upper surface of the sensor substrate 100. In some embodiments, a first passivation layer 110 may be disposed between the upper surface of the sensor substrate 100 and the plurality of color filter layers 130. A guide pattern 120 may be formed on the first passivation layer 110. On the first passivation layer 110 on which the guide pattern 120 is formed, a plurality of color filter layers 130 vertically overlapping a plurality of light sensing elements PD and a plurality of microlenses 150 disposed on the plurality of color filter layers 130 may be disposed. In some embodiments, a second passivation layer 140 may be disposed between the plurality of color filter layers 130 and the plurality of microlenses 150. The microlenses 150 may condense light incident to the semiconductor device for video transmission display 20 on the light sensing element PD of the unit image sensor pixel IPX.

The display unit O-PT may be disposed below the image sensor unit I-PT. The display unit O-PT may include a display substrate 200, a second wiring structure 260 disposed below the display substrate 200, and a light emitting element OLED disposed below the second wiring structure 260.

The display substrate 200 is disposed below the first wiring structure 170 such that the lower surface of the first inter-wiring insulating layer 174 and the upper surface of the display substrate 200 contact each other. The display substrate 200 may be attached under the first wiring structure 170. The display substrate 200 may include an elemental and/or compound semiconductor, such as a group IV semiconductor material, a group III-V semiconductor material, and/or a group II-VI semiconductor material. The sensor substrate 100 may be referred to as a semiconductor substrate, a first semiconductor substrate, a first substrate, a first semiconductor substrate layer, or a first substrate layer; and the display substrate 200 may be referred to as a semiconductor layer, a second semiconductor substrate, a second substrate, a second semiconductor substrate layer, or a second substrate layer.

The second wiring structure 260 may include a plurality of second wiring patterns 262 and a second inter-wiring insulating layer 264 surrounding the plurality of second wiring patterns 262. For example, the plurality of second wiring patterns 262 may include a conductive material, such as tungsten, aluminum, copper, tungsten silicide, titanium silicide, tungsten nitride, titanium nitride, doped polysilicon, and/or the like; and/or the second inter-wiring insulating layer 264 may include an insulating material, such as silicon oxide, silicon nitride, silicon oxynitride, and/or the like.

A metal-oxide-semiconductor field-effect transistor (MOSFET) may be disposed on the display substrate 200 and the second wiring structure 260, and a storage capacitor SC (see FIG. 1) may be disposed in the second wiring structure 260. The MOSFET may constitute the driving transistor DRT and the switching transistor SWT shown in FIG. 1.

The MOSFET may include at least one pair of source/drain regions 230 spaced apart from each other on the display substrate 200, a channel region (which may be a portion of the display substrate 200 between the pair of source/drain regions 230), and a display gate electrode 250 disposed in the second wiring structure 260 overlapping the channel region. A display gate insulating film may be disposed between the channel region of the display substrate 200 and the display gate electrode 250. The display gate electrode 250 may be a part of the plurality of second wiring patterns 262.

The pair of source/drain regions 230 may be doped with impurities of the first conductivity type and the channel region of the display substrate 200 may be doped with impurities of the second conductivity type. In at least some embodiments, the pair of source/drain regions 230 may include higher concentration of impurities than the channel region of the display substrate 200.

The storage capacitor SC (see FIG. 1) may include a lower electrode and an upper electrode vertically overlapping the lower electrode. The lower electrode and the upper electrode of the storage capacitor SC may overlap in the vertical direction with a portion of the second inter-wiring insulating layer 264 therebetween. In these cases, a portion of the second inter-wiring insulating layer 264 may function as a dielectric layer of the storage capacitor SC. In some embodiments, the lower electrode of the storage capacitor SC may be integrally provided with the display gate electrode of the thin film transistor TFT. In some other embodiments, the lower electrode of the storage capacitor SC and the display gate electrode 250 may be separate and independent components spaced apart from each other.

A light emitting element OLED may be disposed on the second wiring structure 260. In some embodiments, a light emitting element OLED may be configured to emit red, green, blue, or white light; and/or the light emitting element OLED may be configured to emit cyan, magenta, or yellow light. For example, a light emitting element OLED may include a first electrode, a second electrode, and a middle layer between the first electrode and the second electrode. The first electrode may be an anode and the second electrode may be a cathode.

In at least some embodiments, the middle layer may include a first functional layer, a light emitting layer, and a second functional layer. The first functional layer and the second functional layer may be selectively disposed below and above the light emitting layer, respectively. For example, in at least one embodiment, the first functional layer may be disposed below the light emitting layer and the second functional layer may be disposed above the light emitting layer. The first functional layer and the second functional layer disposed below and above the light emitting layer may be collectively referred to as organic functional layers.

The semiconductor device for video transmission display 20 may include a plurality of through electrodes 210 electrically connecting an image sensor unit I-PT to a display unit O-PT. Each of the plurality of through electrodes 210 may be a connection path IOCNT shown in FIG. 1. The connection path IOCNT may comprise one of the through electrodes 210. A plurality of through electrodes 210 may extend from the display substrate 200 to the sensor substrate 100. The plurality of through electrodes 210 may pass through the first inter-wiring insulating layer 174 and the display substrate 200.

Each of the plurality of through electrodes 210 may electrically connect the unit image sensor pixel IPX to the unit display pixel OPX corresponding to the same color. In some embodiments, each of the plurality of through electrodes 210 may extend from a portion of the source region of the switching transistor SWT (see FIG. 1) of the pair of source/drain regions 230 to a drain region of a select transistor disposed in the active region of the sensor substrate 100. In some embodiments, each of the plurality of through electrodes 210 may have a tapered shape in which the horizontal width narrows and extends from the display substrate 200 toward the sensor substrate 100.

As the semiconductor device for video transmission display 20 according to the inventive concepts may be reduced in size by implementing an image sensor unit I-PT and a display unit O-PT as a single chip vertically overlapping and disposed, and includes a plurality of through electrodes 210 electrically connecting a plurality of unit image sensor pixels IPX of the image sensor unit I-PT corresponding to the same color to a plurality of unit display pixels OPX of the display unit O-PT, the MOSFET constitutes the driving transistor DRT and the switching transistor SWT shown in FIG. 1 and accordingly, operation performance may be improved.

Figure 5:
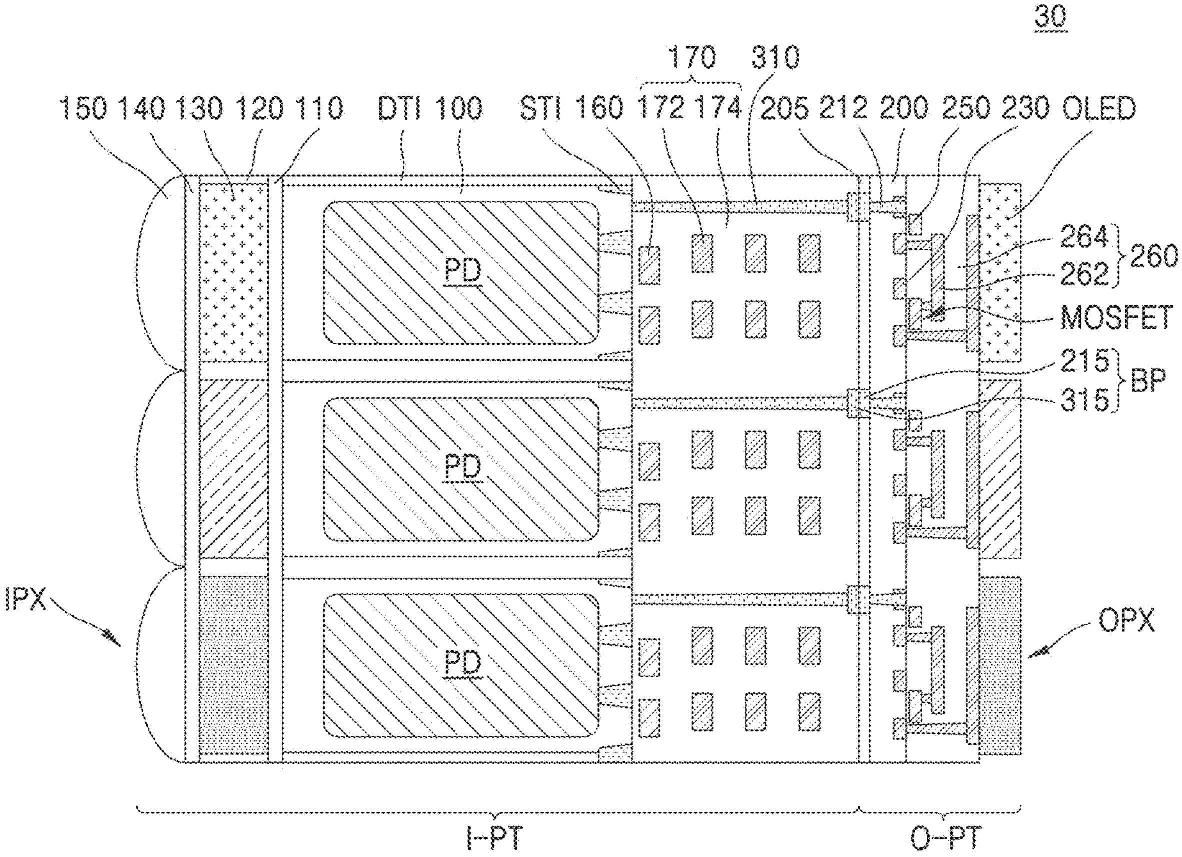
FIG. 5 is a cross-sectional view illustrating a semiconductor device for video transmission display according to at least one embodiment.

FIG. 5 is a cross-sectional view illustrating a semiconductor device for video transmission display according to at least one embodiment.

Referring to FIG. 5, a semiconductor device for video transmission display 30 includes an image sensor unit I-PT and a display unit O-PT. The semiconductor device for video transmission display 30 may be a single chip including the image sensor unit I-PT and the display unit O-PT.

In FIG. 5, to show the case where the semiconductor device for video transmission display 30 is mounted in the electronic device, although it is shown that the image sensor unit I-PT is disposed on the left in the horizontal direction and the display unit O-PT is disposed on the right in the horizontal direction, hereinafter, for convenience of description, it will be described that the image sensor unit I-PT is disposed on the upper side in the vertical direction and the display unit O-PT is disposed on the lower side in the vertical direction. The semiconductor device for video transmission display 30 includes a display unit O-PT and an image sensor unit I-PT disposed on the display unit O-PT.

The image sensor unit I-PT may include a sensor substrate 100 having a plurality of unit image sensor pixels IPX including a plurality of light sensing elements PD, a plurality of microlenses 150 disposed on the sensor substrate 100, a first wiring structure 170 disposed under the sensor substrate 100, and a plurality of color filter layers 130 between the sensor substrate 100 and the plurality of microlenses 150.

An element isolation region STI and a pixel isolation region DTI may be disposed in the sensor substrate 100. In some embodiments, sensor gate electrodes 160 constituting a plurality of transistors may be formed on the lower surface of the sensor substrate 100. A first wiring structure 170 may be disposed on the lower surface of the sensor substrate 100. The first wiring structure 170 may include a plurality of first wiring patterns 172 and a first inter-wiring insulating layer 174 surrounding the plurality of first wiring patterns 172.

A plurality of color filter layers 130 may be disposed on the upper surface of the sensor substrate 100. In some embodiments, a first passivation layer 110 may be disposed between the upper surface of the sensor substrate 100 and the plurality of color filter layers 130. A guide pattern 120 may be formed on the first passivation layer 110. On the first passivation layer 110 on which the guide pattern 120 is formed, a plurality of color filter layers 130 vertically overlapping a plurality of light sensing elements PD and a plurality of microlenses 150 disposed on the plurality of color filter layers 130 may be disposed. In some embodiments, a second passivation layer 140 may be disposed between the plurality of color filter layers 130 and the plurality of microlenses 150. The microlenses 150 may condense light incident to the semiconductor device for video transmission display 10 on the light sensing element PD of the unit image sensor pixel IPX.

The display unit O-PT may be disposed below the image sensor unit I-PT. The display unit O-PT may include a buffer insulating layer 205, a display substrate 200 disposed under the buffer insulating layer 205, a second wiring structure 260 disposed under the display substrate 200, and a light emitting element OLED disposed below the second wiring structure 260. The sensor substrate 100 may be referred to as a semiconductor substrate, a first semiconductor substrate, a first substrate, a first semiconductor substrate layer, or a first substrate layer, and/or the display substrate 200 may be referred to as a semiconductor layer, a second semiconductor substrate, a second substrate, a second semiconductor substrate layer, or a second substrate layer.

The buffer insulating layer 205 may be disposed below the first wiring structure 170, and a lower surface of the first inter-wiring insulating layer 174 and an upper surface of the buffer insulating layer 205 may be bonded by forming a covalent bond. The display substrate 200 may be disposed under the buffer insulating layer 205. The second wiring structure 260 may include a plurality of second wiring patterns 262 and a second inter-wiring insulating layer 264 surrounding the plurality of second wiring patterns 262.

A MOSFET may be disposed on the display substrate 200 and the second wiring structure 260, and a storage capacitor SC (see FIG. 1) may be disposed on the second wiring structure 260. The MOSFET may constitute the driving transistor DRT and the switching transistor SWT shown in FIG. 1.

A light emitting element OLED may be disposed on the second wiring structure 260. In some embodiments, a light emitting element OLED may be configured to emit red, green, blue, or white light. In some other embodiments, the light emitting element OLED may be configured to emit cyan, magenta, or yellow light. For example, a light emitting element OLED may include a first electrode, a second electrode, and a middle layer between the first electrode and the second electrode. The first electrode may be an anode and the second electrode may be a cathode.

The semiconductor device for video transmission display 30 may include a plurality of first through electrodes 310 and a plurality of second through electrodes 212 electrically connecting an image sensor unit I-PT to a display unit O-PT. The plurality of first through electrodes 310 may extend from the display unit O-PT to the sensor substrate 100. The plurality of first through electrodes 310 may pass through the first inter-wiring insulating layer 174. The plurality of second through electrodes 212 may pass through the display substrate 200.

Each of the plurality of first through electrodes 310 and a corresponding one of the plurality of second through electrodes 212 may electrically connect a unit image sensor pixel IPX to a unit display pixel OPX corresponding to the same color. A plurality of first connection pads 315 and a plurality of second connection pads 215 may be disposed between the plurality of first through electrodes 310 and the plurality of second through electrodes 212 corresponding to each other. A plurality of first connection pads 315 and a plurality of second connection pads 215 may be disposed between the plurality of first through electrodes 310 and the plurality of second through electrodes 212 corresponding to each other. The connection path IOCNT may include two through electrodes and two connection pads (e.g., a first through electrode 310, a first connection pad 315, a second connection pad 215, and a second through electrode 212, and one through electrode 300).

The plurality of first connection pads 315 may be buried in the first inter-wiring insulating layer 174 and exposed on a lower surface of the first inter-wiring insulating layer 174. The plurality of first through electrodes 310 may extend from the drain region of the select transistor disposed in the active region of the sensor substrate 100 to pass through the first inter-wiring insulating layer 174 and be connected to the plurality of first connection pads 315. The plurality of second connection pads 215 may be buried in the buffer insulating layer 205 and exposed on an upper surface of the buffer insulating layer 205. The plurality of second through electrodes 212 may extend from a portion of the source region of the switching transistor SWT (see FIG. 1) to penetrate the display substrate 200 among the pair of source/drain regions 230 and may be connected to a plurality of second connection pads 215.

In some embodiments, the plurality of first connection pads 315 and the plurality of second connection pads 215, which correspond to each other, may be expanded by heat to come into contact with each other, and may be a plurality of bonding pads BP that are diffusion bonded to form an integral body through diffusion of metal atoms including the metal atoms. After the display unit O-PT and the image sensor unit I-PT are separately formed, a semiconductor device for video transmission display 30 may be formed by hybrid bonding between the display unit O-PT and the image sensor unit I-PT.

The semiconductor device for video transmission display 30 according to the inventive concepts may be reduced in size by implementing an image sensor unit I-PT and a display unit O-PT as a single chip vertically overlapping and disposed, and includes a plurality of first through electrodes 310 and a plurality of second through electrodes 212 electrically connecting a plurality of unit image sensor pixels IPX of the image sensor unit I-PT corresponding to the same color to a plurality of unit display pixels OPX of the display unit O-PT, and since the MOSFET constitutes the driving transistor DRT and the switching transistor SWT, the operating performance may be improved.

FIGS. 6A to 6F are cross-sectional views illustrating a manufacturing method of a semiconductor device for video transmission display, according to at least one embodiment.

Figure 6A:
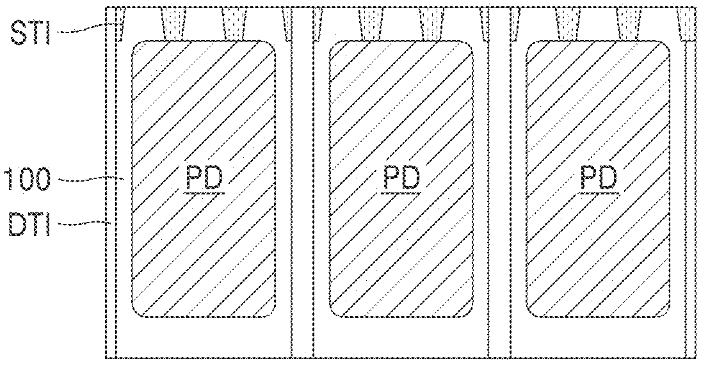
FIGS. 6A to 6F are cross-sectional views illustrating a manufacturing method of a semiconductor device for video transmission display, according to at least one embodiment.

Referring to FIG. 6A, a sensor substrate 100 having upper and lower surfaces opposite to each other is prepared. The upper surface of the sensor substrate 100 may be the lower surface of the sensor substrate 100 shown in FIG. 3 (e.g., the first surface, and the lower surface of the sensor substrate 100 of FIG. 6A may be the upper surface, that is, the second surface of the sensor substrate 100 shown in FIG. 3). In some embodiments, the sensor substrate 100 may be doped with impurities of the first conductivity type.

An element isolation region STI and a pixel isolation region DTI are formed on the sensor substrate 100. The element isolation region STI may be formed to extend from the upper surface of the sensor substrate 100 to the inside, and the pixel isolation region DTI may be formed to extend from the upper surface to the lower surface of the sensor substrate 100. For example, the pixel isolation region DTI may be formed to pass through a part of the element isolation region STI and the sensor substrate 100 together.

A plurality of light sensing elements PD are formed in the sensor substrate 100. Each of the plurality of light sensing elements PD may be formed by doping a portion of the sensor substrate 100 surrounded at least in part by a pixel isolation region DTI with impurities of a second conductivity type that is different from the first conductivity type.

Figure 6B:
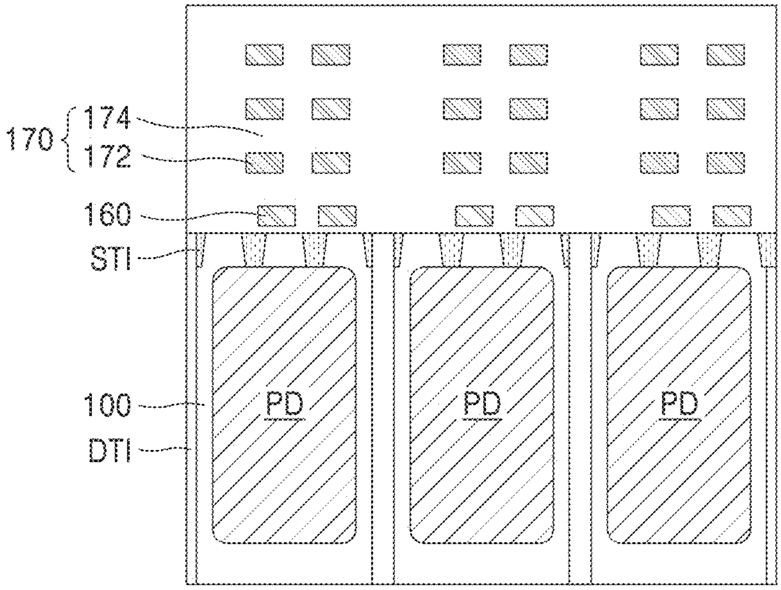

Referring to FIG. 6B, the sensor gate electrodes 160 constituting the plurality of transistors are formed on the sensor substrate 100, and a first wiring structure 170 is formed on the sensor substrate 100. The first wiring structure 170 may be formed to include a plurality of first wiring patterns 172, and a first inter-wiring insulating layer 174 surrounding the sensor gate electrodes 160 and the plurality of first wiring patterns 172.

Figure 6C:
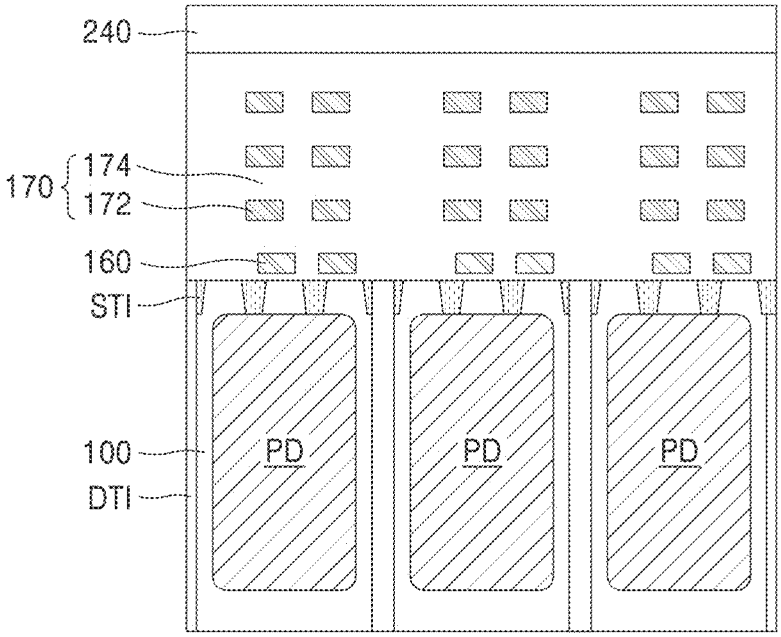

Referring to FIG. 6C, a base insulating layer 240 is formed on the first wiring structure 170.

Figure 6D:
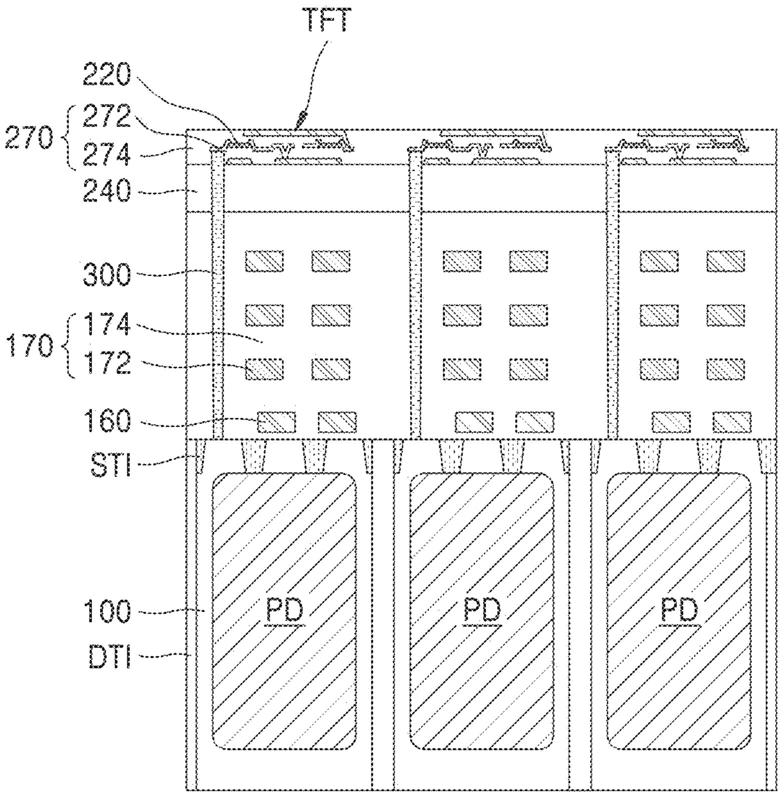

Referring to FIG. 6D, a second wiring structure 270 and a plurality of through electrodes 300 are formed on the base insulating layer 240. The second wiring structure 270 may be formed to include a plurality of second wiring patterns 272 and a second inter-wiring insulating layer 274 surrounding the plurality of second wiring patterns 272. The second wiring structure 270 may be formed such that a thin film transistor TFT including the semiconductor layer 220 and a storage capacitor SC (see FIG. 1) are disposed in the second wiring structure 270.

The plurality of through electrodes 300 may be formed to extend to the sensor substrate 100 through a portion of the second inter-wiring insulating layer 274 and through the first inter-wiring insulating layer 174. The plurality of through electrodes 300 may be formed after forming a part of the second inter-wiring insulating layer 274 included in the second wiring structure 270, or the plurality of through electrodes 300 may be formed after a portion of the second inter-wiring insulating layer 274 included in the second wiring structure 270 and a portion of the plurality of second wiring patterns 272 are formed, and after the plurality of through electrodes 300 are formed, the remaining part of the second wiring structure 270 may be formed.

Figure 6E:
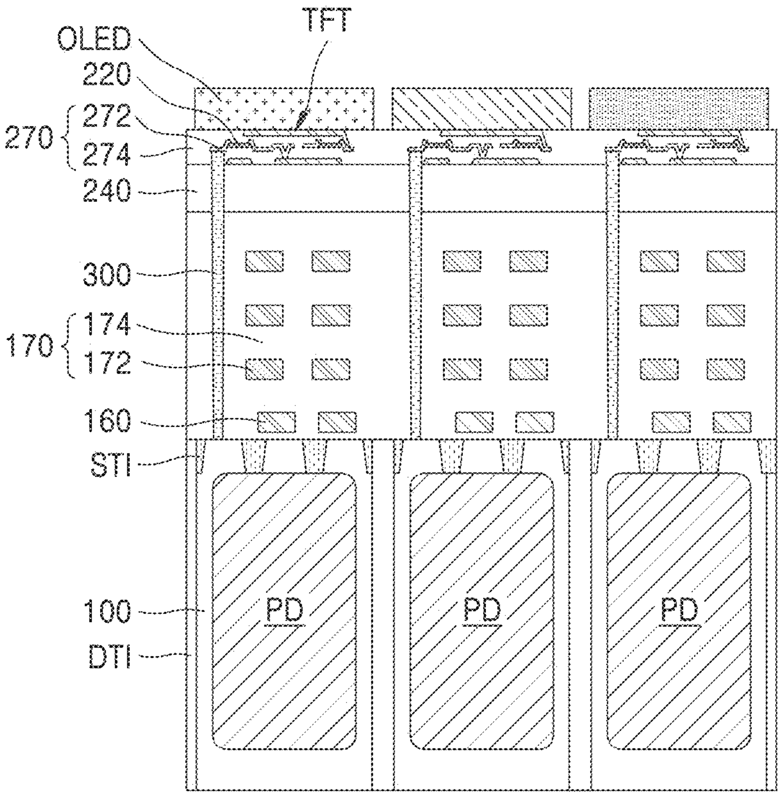

Referring to FIG. 6E, a light emitting element OLED is formed on the second wiring structure 270.

Figure 6F:
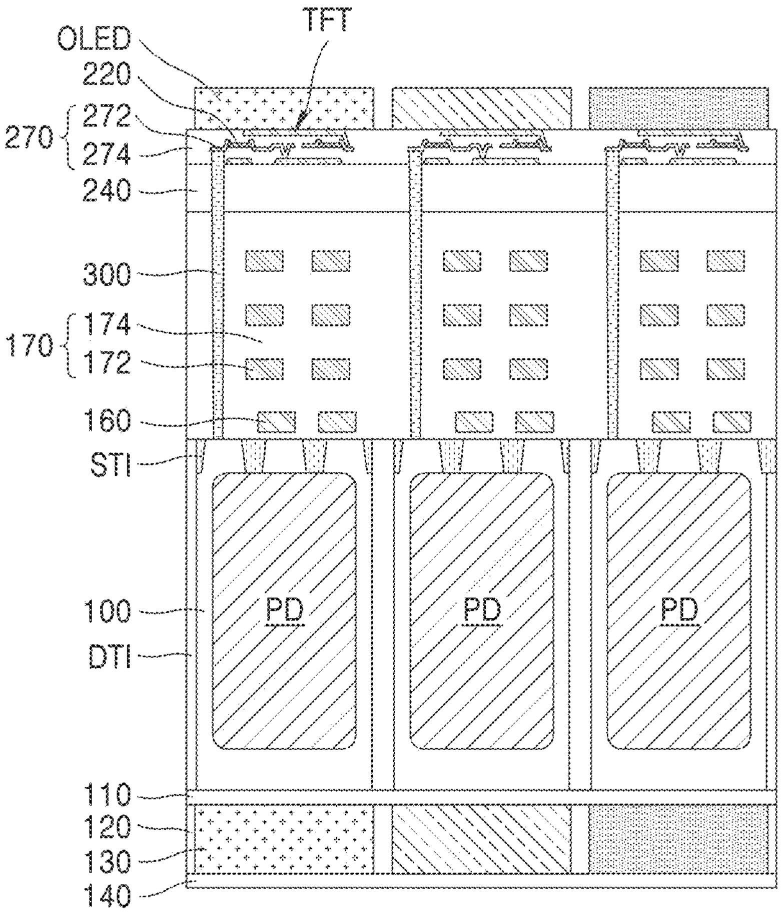

Referring to FIG. 6F, a guide pattern 120 and a plurality of color filter layers 130 are formed on the lower surface of the sensor substrate 100. In some embodiments, the first passivation layer 110 covering the lower surface of the sensor substrate 100 may be formed before forming the guide pattern 120 and the plurality of color filter layers 130. In some embodiments, after forming the plurality of color filter layers 130, the second passivation layer 140 may be formed.

In at least some embodiments, before forming the first passivation layer 110, the guide pattern 120, the plurality of color filter layers 130, and the second passivation layer 140, the first passivation layer 110, the guide pattern 120, the plurality of color filter layers 130, and the second passivation layer 140 may be formed upside down to the resultant shown in FIG. 6E.

Thereafter, a semiconductor device for video transmission display 10 may be formed by forming a plurality of microlenses 150 shown in FIG. 3.

FIGS. 7A to 7F are cross-sectional views illustrating a manufacturing method of a semiconductor device for video transmission display, according to at least one embodiment.

Figure 7A:
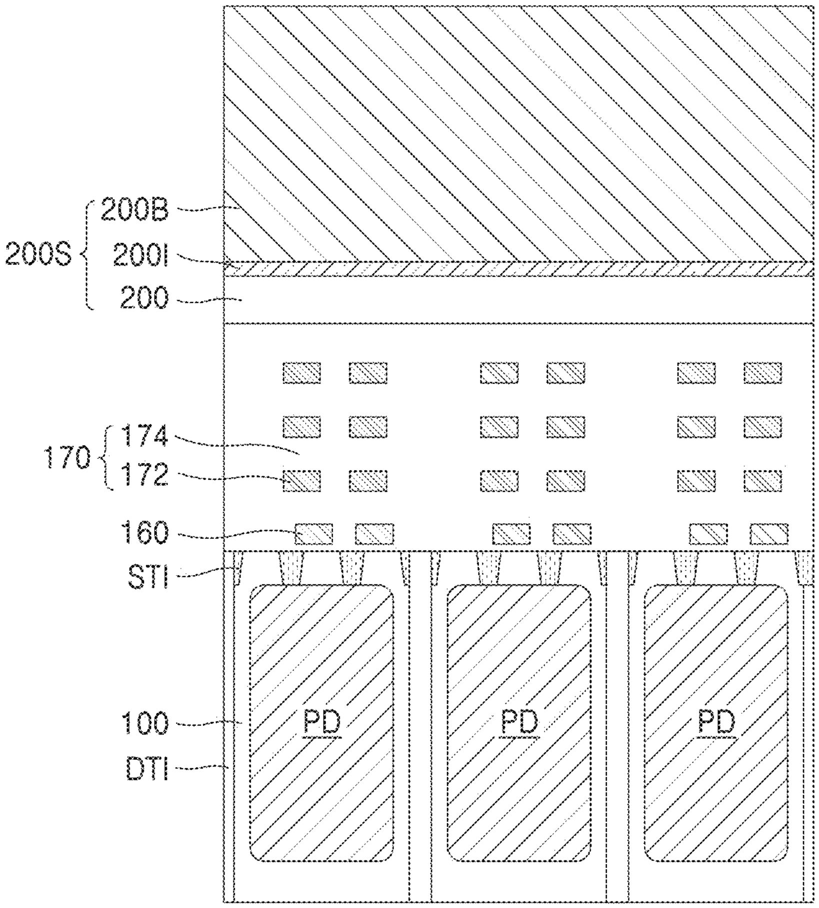
FIGS. 7A to 7F are cross-sectional views illustrating a manufacturing method of a semiconductor device for video transmission display, according to at least one embodiment.

Referring to FIG. 7A, a Silicon on Insulator (SOI) substrate 200S is attached on the result of FIG. 6B. The SOI substrate 200S may include a display substrate 200, a base substrate 200B, and a buried insulating layer 200I disposed between the display substrate 200 and the base substrate 200B. The base substrate 200B may include a semiconductor material, and the buried insulating layer 200I may include an oxide.

Figure 7B:
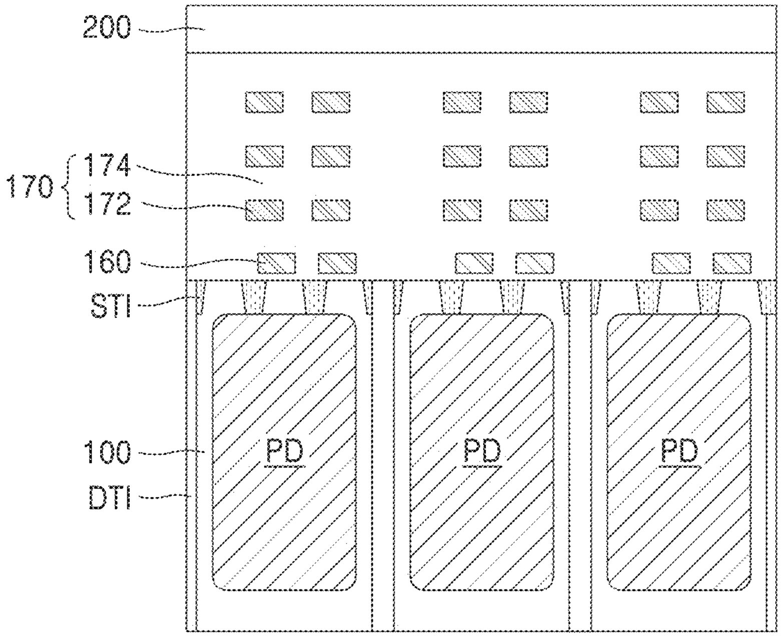

Referring to FIGS. 7A and 7B, by removing the filling insulating layer 200I and the base substrate 200B from the display substrate 200, the display substrate 200 attached to the upper surface of the first wiring structure 170 remains.

Figure 7C:
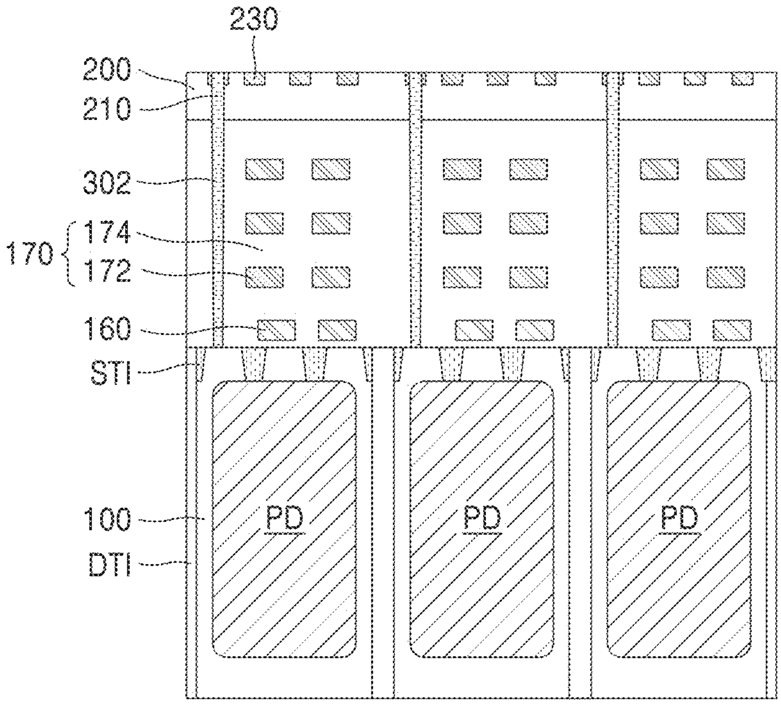

Referring to FIG. 7C, a plurality of source/drain regions 230 are formed on an upper part of the display substrate 200, and a plurality of through electrodes 210 penetrating the display substrate 200 and the first inter-wiring insulating layer 174 are formed. A plurality of through electrodes 210 may be formed to pass through some of the plurality of source/drain regions 230.

Figure 7D:
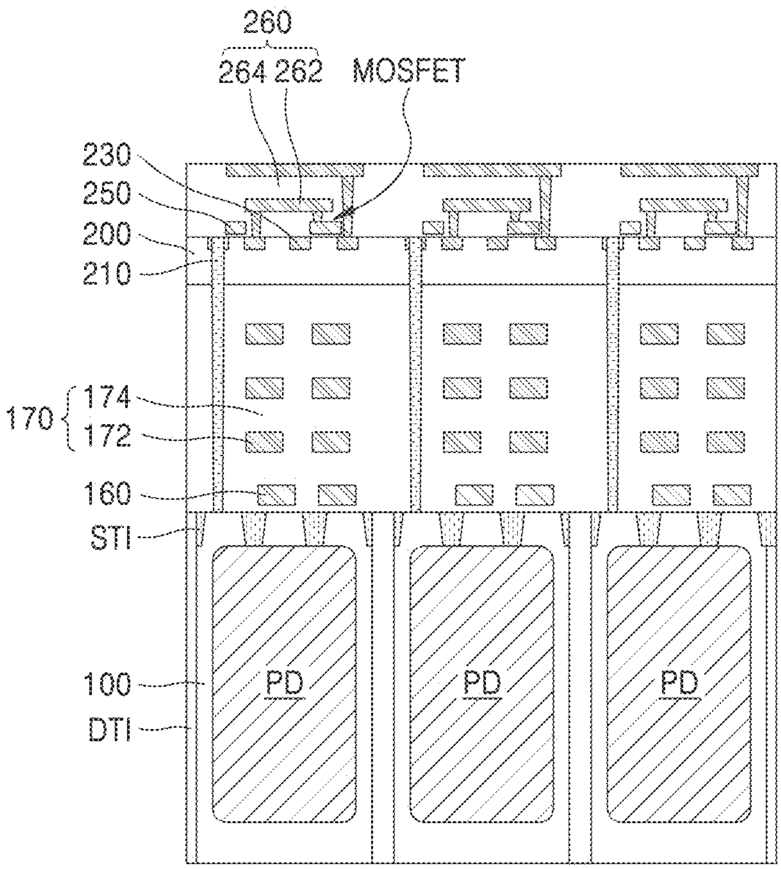

Referring to FIG. 7D, a second wiring structure 260 is formed on the display substrate 200. The second wiring structure 260 may be formed to include a plurality of second wiring patterns 262 and a second inter-wiring insulating layer 264 surrounding the plurality of second wiring patterns 262. The second wiring structure 260 may be formed so that a MOSFET is disposed on the display substrate 200 and the second wiring structure 260, and a storage capacitor SC (see FIG. 1) is disposed in the second wiring structure 260.

Figure 7E:
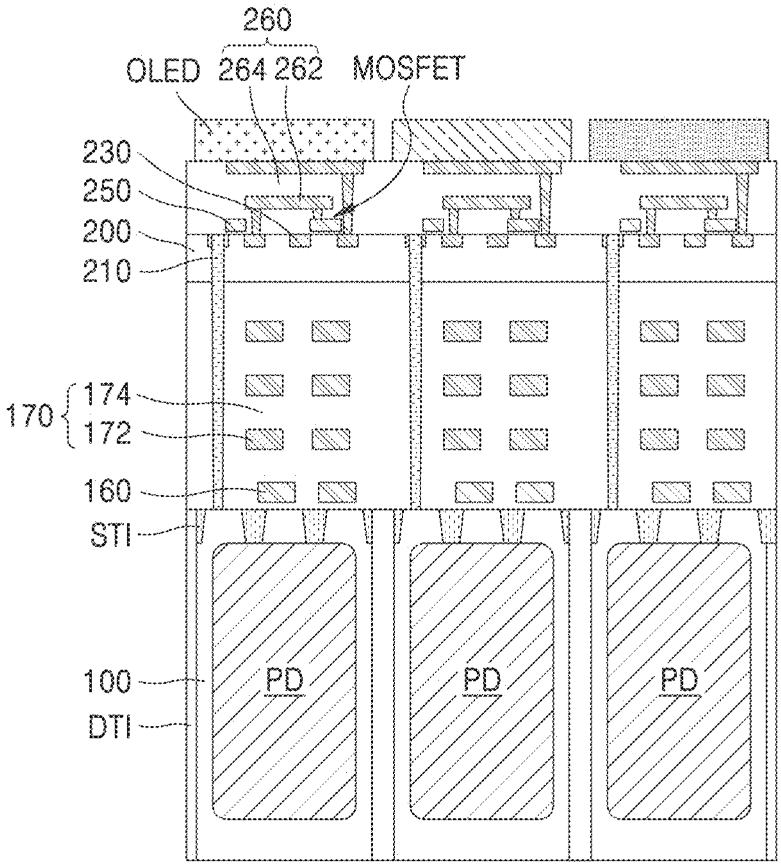
Figure 7F:
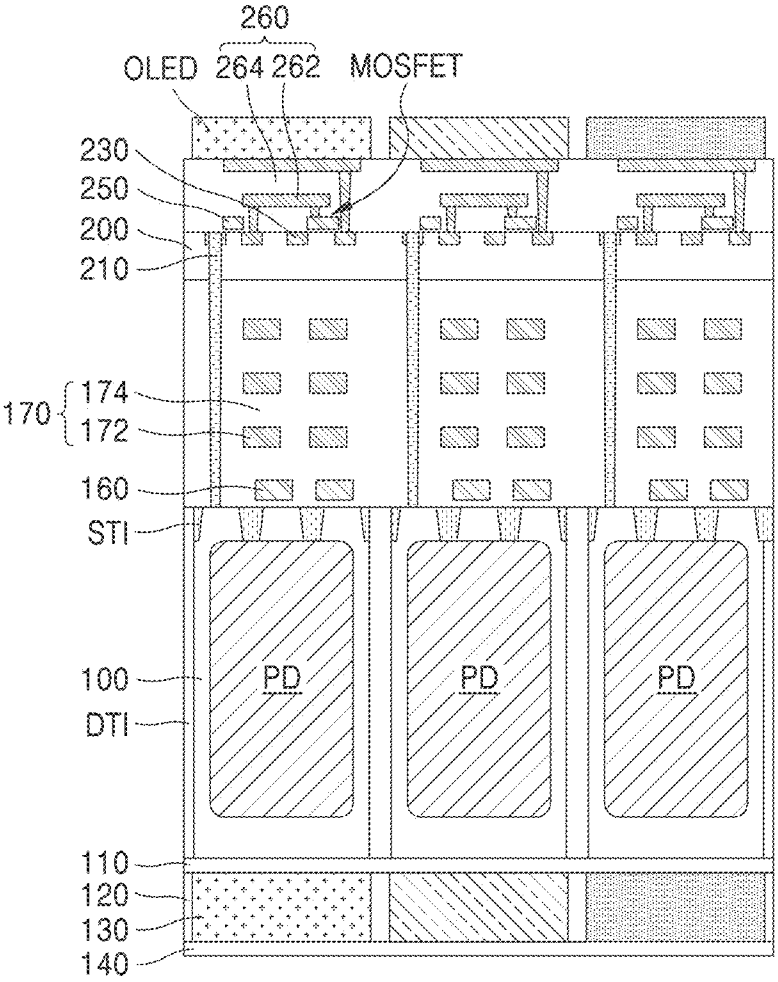

Referring to FIG. 7E, a light emitting element OLED is formed on the second wiring structure 260.

Referring to FIG. 7E, a guide pattern 120 and a plurality of color filter layers 130 are formed on the lower surface of the sensor substrate 100. In some embodiments, the first passivation layer 110 covering the lower surface of the sensor substrate 100 may be formed before forming the guide pattern 120 and the plurality of color filter layers 130. In some embodiments, after forming the plurality of color filter layers 130, the second passivation layer 140 may be formed.

Before forming the first passivation layer 110, the guide pattern 120, the plurality of color filter layers 130, and the second passivation layer 140, the first passivation layer 110, the guide pattern 120, the plurality of color filter layers 130, and the second passivation layer 140 may be formed upside down to the resultant shown in FIG. 7E.

Thereafter, a semiconductor device for video transmission display 20 may be formed by forming a plurality of micro-lenses 150 shown in FIG. 4.

FIGS. 8A to 8D are cross-sectional views illustrating a manufacturing method of a semiconductor device for video transmission display, according to at least one embodiment.

Figure 8A:
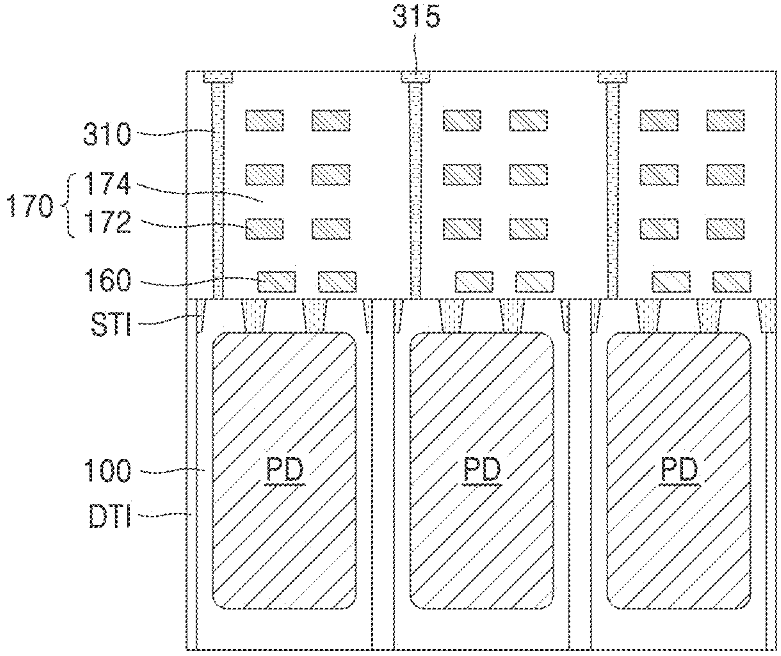
FIGS. 8A to 8D are cross-sectional views illustrating a manufacturing method of a semiconductor device for video transmission display, according to at least one embodiment.

Referring to FIG. 8A, a plurality of first through electrodes 310 and a plurality of first connection pads 315 are formed on the result of FIG. 6B. The plurality of first through electrodes 310 may be formed to pass through the first inter-wiring insulating layer 174. The plurality of first connection pads 315 are connected to the plurality of first through electrodes 310 and may be formed to be buried in the first inter-wiring insulating layer 174.

Figure 8B:
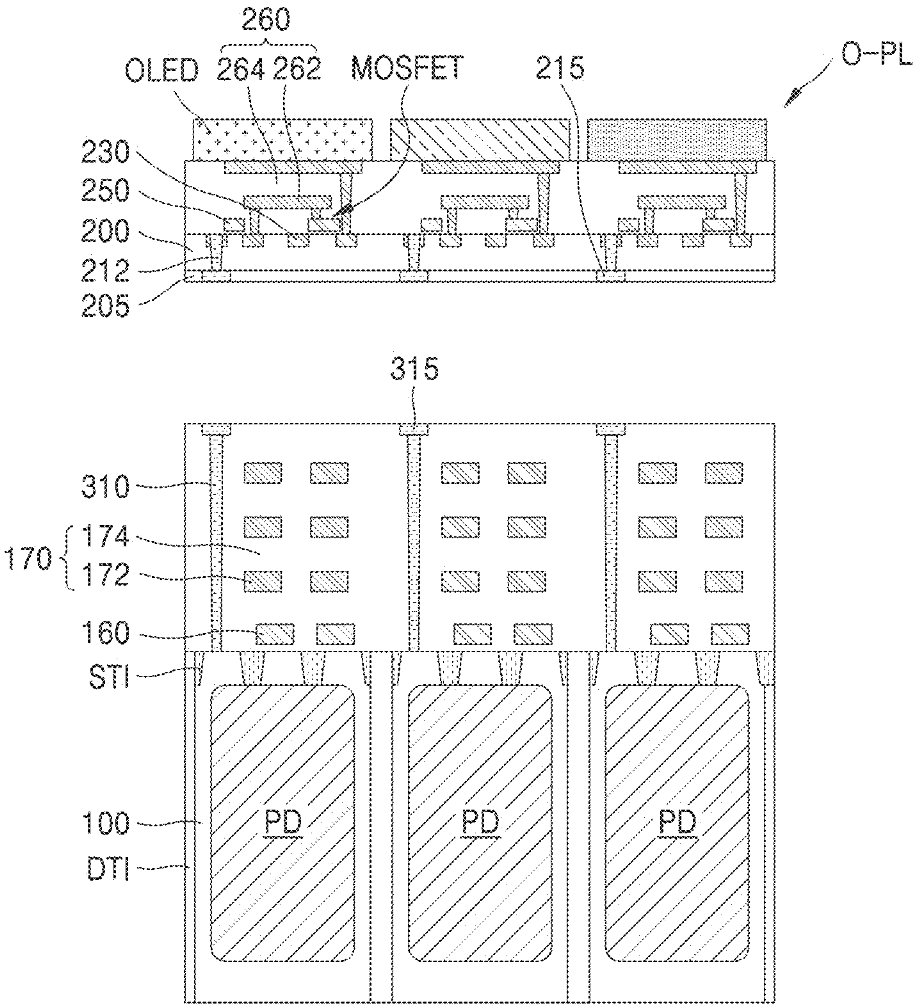

Referring to FIG. 8B, a preliminary display unit O-PL is prepared. The preliminary display unit O-PL may include a display substrate 200, a buffer insulating layer 205 covering the display substrate 200, a plurality of second connection pads 215 buried in the buffer insulating layer 205 and exposed on the lower surface of the buffer insulating layer 205, a second wiring structure 260 disposed on the display substrate 200, and a light emitting element OLED disposed on the second wiring structure 260.

Figure 8C:
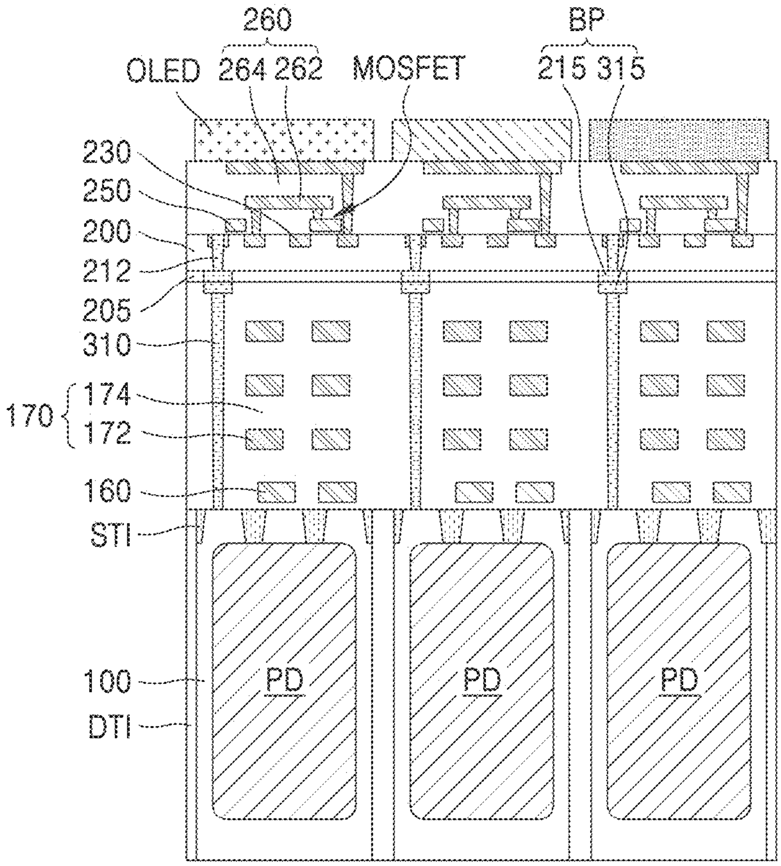

Referring to FIGS. 8B and 8C together, the buffer insulating layer 205 and the first inter-wiring insulating layer 174 are in contact with each other, and a preliminary display unit O-PL is attached on the result of FIG. 8A so that the plurality of first connection pads 315 and the plurality of second connection pads 215 contact each other.

The lower surface of the buffer insulating layer 205 and the upper surface of the first inter-wiring insulating layer 174 may be bonded to each other by contact bonding and/or by forming a covalent bond. The plurality of first connection pads 315 and the plurality of second connection pads 215, which correspond to each other, may be expanded by heat to come into contact with each other, and may be a plurality of bonding pads BP that are diffusion bonded to form an integral body through diffusion of metal atoms including the metal atoms.

Figure 8D:
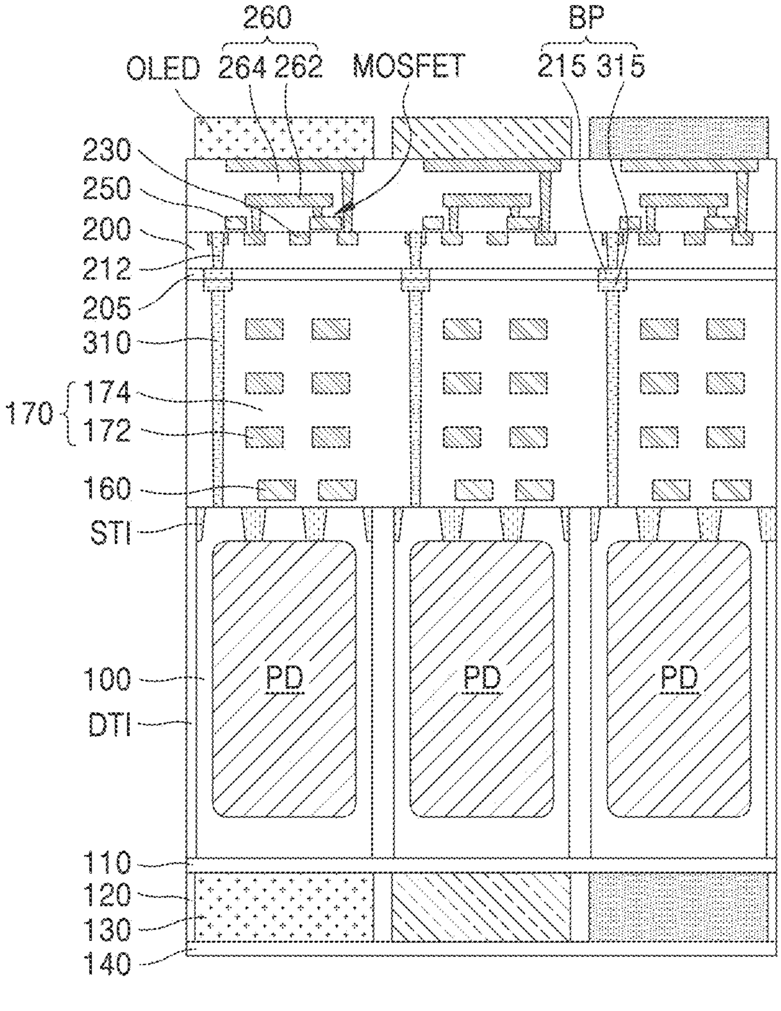

Referring to FIG. 8D, a guide pattern 120 and a plurality of color filter layers 130 are formed on the lower surface of the sensor substrate 100. In some embodiments, the first passivation layer 110 covering the lower surface of the sensor substrate 100 may be formed before forming the guide pattern 120 and the plurality of color filter layers 130. In some embodiments, after forming the plurality of color filter layers 130, the second passivation layer 140 may be formed.

Before forming the first passivation layer 110, the guide pattern 120, the plurality of color filter layers 130, and the second passivation layer 140, the first passivation layer 110, the guide pattern 120, the plurality of color filter layers 130, and the second passivation layer 140 may be formed upside down to the resultant shown in FIG. 8C.

Thereafter, a semiconductor device for video transmission display 30 may be formed by forming a plurality of micro-lenses 150 shown in FIG. 5.

Figure 9:
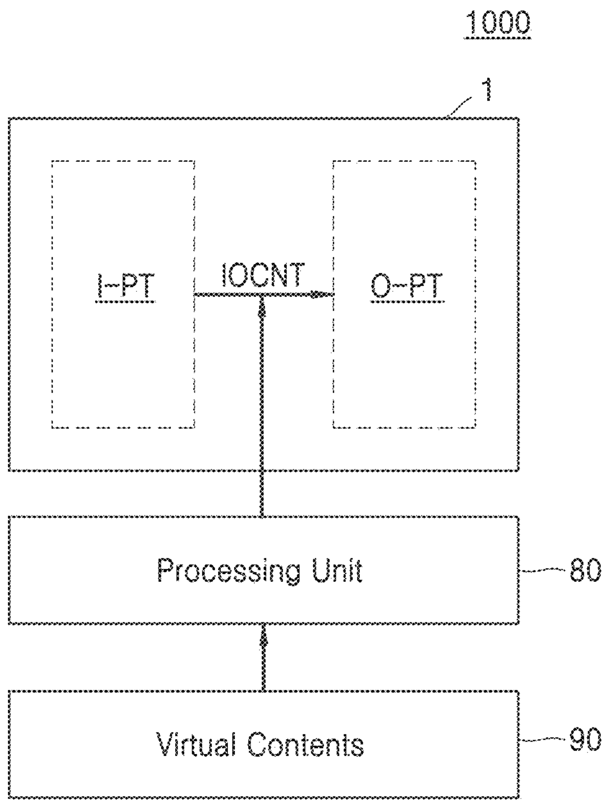
FIG. 9 is a block diagram illustrating a configuration of an electronic device including a semiconductor device for video transmission display, according to at least one embodiment.

FIG. 9 is a block diagram illustrating a configuration of an electronic device including a semiconductor device for video transmission display, according to at least one embodiment.

Referring to FIG. 9, an electronic device 1000 may include a semiconductor device for video transmission display 1, a processing unit 80, and virtual content 90. For example, the electronic device 1000 may be a video transmission display device such as a head mounted display (HMD). The semiconductor device for video transmission display 1 may be any one of the semiconductor devices for video transmission displays 10, 20, and 30 shown in FIGS. 3 to 5.

A semiconductor device for video transmission display 1 includes an image sensor unit I-PT and a display unit O-PT. The image sensor unit I-PT and the display unit O-PT may be electrically connected through a connection path IOCNT. The connection path IOCNT may be each of the plurality of through electrodes 300 shown in FIG. 3, each of the plurality of through electrodes 210 shown in FIG. 4, or, a plurality of first through electrodes 310 corresponding to each other shown in FIG. 5, a plurality of second through electrodes 212, and a plurality of first connection pads 315.

The processing unit 80 may be electrically connected to the connection path IOCNT. The processing unit 80 may deliver the virtual content 90 to the display unit O-PT through the connection path IOCNT. The display unit O-PT may receive the signal for the image detected by the image sensor unit I-PT and the signal for the virtual content 90 transmitted through the processing unit 80 together through the connection path IOCNT, and display the image and/or video sensed by the image sensor unit I-PT and the virtual content 90 to the user in a combined form.

The processing unit 80 and the virtual content 90 may be implemented in the form of processing circuitry, such as software, hardware, or a combination thereof. For example, the processing circuitry more specifically may include, but is not limited to, electronic circuits including electrical components such as at least one of transistors, resistors, capacitors, etc., a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. For example, in at least one embodiment, the processing unit 80 may comprise processing circuitry and the virtual content 90 may comprise computer executable instructions stored in, e.g., memory.

Since the electronic device 1000 according to the inventive concepts includes a semiconductor device for video transmission display 1 with reduced size and improved operational performance, the reduced size makes it easy for a user to wear, and may provide high-performance augmented reality (AR).

While the inventive concepts have been particularly shown and described with reference to embodiments thereof, it will be understood that various changes in form and details may be made therein without departing from the spirit and scope of the following claims.

What is claimed is:

1. A semiconductor device for video transmission display, the semiconductor device comprising:
- an image sensor unit including
  - a semiconductor substrate,
  - a plurality of light sensing elements in the semiconductor substrate and constituting a plurality of unit image sensor pixels,
  - a first wiring structure on a first surface of the semiconductor substrate, the first wiring structure including a plurality of first wiring patterns and a first inter-wiring insulating layer surrounding the plurality of first wiring patterns,
  - a plurality of color filter layers on a second surface of the semiconductor substrate such that the plurality of color filter layers at least partially overlap corresponding light sensing elements of the plurality of light sensing elements, and
  - a plurality of microlenses on the plurality of color filter layers;
- a display unit including a second wiring structure on the first wiring structure and including a plurality of second wiring patterns and a second inter-wiring insulating layer surrounding the plurality of second wiring patterns, and a plurality of light emitting elements on the second wiring structure and constituting a plurality of unit display pixels; and
- a plurality of connection paths electrically connecting each of the plurality of unit image sensor pixels to a corresponding one of the plurality of unit display pixels, the plurality of connection paths each including at least one through electrode.

2. The semiconductor device for video transmission display of claim 1, wherein the plurality of unit image sensor pixels and the plurality of unit display pixels corresponding to a same color overlap each other, at least in part, in a vertical direction.

3. The semiconductor device for video transmission display of claim 2, wherein the plurality of unit image sensor pixels and the plurality of unit display pixels corresponding to different colors do not overlap each other in the vertical direction.

4. The semiconductor device for video transmission display of claim 1, wherein the display unit further comprises a base insulating layer between the first wiring structure and the second wiring structure.

5. The semiconductor device for video transmission display of claim 4, wherein the through electrodes extend into the second inter-wiring insulating layer through the first inter-wiring insulating layer and the base insulating layer.

6. The semiconductor device for video transmission display of claim 1, wherein the display unit further comprises a semiconductor layer between the first wiring structure and the second wiring structure.

7. The semiconductor device for video transmission display of claim 6, wherein the through electrodes penetrate the first inter-wiring insulating layer and the semiconductor layer.

8. The semiconductor device for video transmission display of claim 6, wherein
- the through electrodes each comprise a first through electrode and a second through electrode electrically connected to the first through electrode, and
- each of the plurality of connection paths comprises the first through electrode penetrating the first inter-wiring insulating layer and the second through electrode penetrating the semiconductor layer.

9. The semiconductor device for video transmission display of claim 8, wherein
- the display unit further comprises a buffer insulating layer between the first wiring structure and the semiconductor layer,
- the image sensor unit further comprises
  - a first connection pad connected to the first through electrode and buried in the first inter-wiring insulating layer, and
  - a second connection pad buried in the buffer insulating layer, connected to the second through electrode, and in contact with the first connection pad, and
- each of the plurality of connection paths comprises the first through electrode, the first connection pad, the second connection pad, and the second through electrode.

10. The semiconductor device for video transmission display of claim 6, wherein
- the display unit further comprises a display pixel circuit connected to each of the plurality of light emitting elements, the display pixel circuit including a driving transistor and a switching transistor, and
- each of the driving transistor and the switching transistor comprises a metal oxide semiconductor field effect transistor (MOSFET) on the semiconductor layer and the second wiring structure.

11. A semiconductor device for video transmission display, the semiconductor device comprising:
- a display unit including a plurality of unit display pixels, each of the unit display pixels comprising a light emitting element;
- an image sensor unit including a plurality of unit image sensor pixels, each of the plurality of unit image sensors pixels including a light sensing element, at least portions of unit image sensor pixels of the plurality of unit image sensor pixels and corresponding ones of the plurality of unit display pixels corresponding to a same color overlap each other in a vertical direction; and
- a plurality of connection paths, each including at least one through electrode, electrically connecting the plurality of unit image sensor pixels to the plurality of unit display pixels corresponding to the same color.

12. The semiconductor device for video transmission display of claim 11, wherein the image sensor unit further comprises:
- a semiconductor substrate on which the plurality of light sensing elements are positioned;
- a first wiring structure on a first surface of the semiconductor substrate, the first wiring structure including a plurality of first wiring patterns and a first inter-wiring insulating layer surrounding the plurality of first wiring patterns;

a plurality of color filter layers on a second surface of the semiconductor substrate opposite to the first surface, the plurality of color filter layers each at least partially overlapping a corresponding one of the plurality of light sensing elements; and a plurality of microlenses on the plurality of color filter layers, wherein the through electrodes penetrate the first inter-wiring insulating layer.

13. The semiconductor device for video transmission display of claim 12, wherein the display unit further comprises:

a second wiring structure on the first wiring structure, the second wiring structure including a plurality of second wiring patterns and a second inter-wiring insulating layer surrounding the plurality of second wiring patterns, and a display pixel circuit connected to each of the plurality of light emitting elements and including a driving transistor and a switching transistor, wherein the plurality of light emitting elements are on the second wiring structure opposite to the first wiring structure, and at least a portion of each of the driving transistor and the switching transistor is on the second wiring structure.

14. The semiconductor device for video transmission display of claim 13, wherein the image sensor unit further comprises:

a transfer transistor, a reset transistor, a source follower transistor, and a select transistor, and wherein each of the plurality of connection paths electrically connects a source region of the switching transistor to a drain region of the select transistor.

15. The semiconductor device for video transmission display of claim 13, wherein each of the driving transistor and the switching transistor comprises a metal oxide semiconductor field effect transistor (MOSFET).

16. The semiconductor device for video transmission display of claim 15, wherein the display unit further comprises a semiconductor layer between the first wiring structure and the second wiring structure, and the plurality of connection paths pass through the first inter-wiring insulating layer and the semiconductor layer.

17. The semiconductor device for video transmission display of claim 13, wherein each of the driving transistor and the switching transistor comprises a thin film transistor.

18. The semiconductor device for video transmission display of claim 17, wherein the display unit further comprises a base insulating layer between the first wiring structure and the second wiring structure, and the plurality of connection paths extend into the second inter-wiring insulating layer through the first inter-wiring insulating layer and the base insulating layer.

19. A semiconductor device for video transmission display, the semiconductor device comprising:

an image sensor unit including a semiconductor substrate, a plurality of light sensing elements in the semiconductor substrate and constituting a plurality of unit image sensor pixels, a plurality of sensor gate electrodes on a first surface of the semiconductor substrate and constituting a plurality of transistors including a transfer transistor, a reset transistor, a source follower transistor, and a select transistor, a first wiring structure on the first surface of the semiconductor substrate, the first wiring structure including a plurality of first wiring patterns and a first inter-wiring insulating layer surrounding the plurality of first wiring patterns and the plurality of sensor gate electrodes, a plurality of color filter layers on a second surface of the semiconductor substrate such that each of the plurality of color filter layers at least partially overlap corresponding light sensing elements of the plurality of corresponding light sensing elements, and a plurality of microlenses on the plurality of color filter layers;

a display unit on the first wiring structure opposite to the semiconductor substrate and including a second wiring structure including a plurality of second wiring patterns and a second inter-wiring insulating layer surrounding the plurality of second wiring patterns, a semiconductor layer between the first wiring structure and the second wiring structure, a plurality of light emitting elements on the second wiring structure, the plurality of light emitting elements constituting a plurality of unit display pixels, and a display pixel circuit connected to each of the plurality of light emitting elements, the display pixel circuit including a driving transistor and a switching transistor, each of which is a metal oxide semiconductor field effect transistor; and a plurality of connection paths, each of the plurality of connection paths including at least one through electrode penetrating the first inter-wiring insulating layer and the semiconductor layer, and electrically connecting the plurality of unit image sensor pixels to the plurality of unit display pixels corresponding to a same color, and wherein the plurality of unit image sensor pixels and the plurality of unit display pixels corresponding to the same color overlap, at least in part, to each other in a vertical direction.

20. The semiconductor device for video transmission display of claim 19, wherein the through electrodes included in each of the plurality of connection paths is connected such that a source region of the switching transistor and a drain region of the select transistor have an equal voltage potential.

* * * * *